US012563941B2

(12) United States Patent
Kim et al.

(10) Patent No.: US 12,563,941 B2
(45) Date of Patent: Feb. 24, 2026

(54) COLOR CONVERSION SUBSTRATE, DISPLAY DEVICE INCLUDING THE SAME, AND METHOD OF MANUFACTURING COLOR CONVERSION SUBSTRATE

(71) Applicant: Samsung Display Co., Ltd., Yongin-si (KR)

(72) Inventors: Ran Kim, Asan-si (KR); Kihyun Kim, Hwaseong-si (KR); Younggil Park, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 467 days.

(21) Appl. No.: 18/095,218

(22) Filed: Jan. 10, 2023

(65) Prior Publication Data

US 2023/0413637 A1 Dec. 21, 2023

(30) Foreign Application Priority Data

Jun. 16, 2022 (KR) ........................ 10-2022-0073510

(51) Int. Cl.
*H10K 59/38* (2023.01)
(52) U.S. Cl.
CPC ................................... *H10K 59/38* (2023.02)
(58) Field of Classification Search
None
See application file for complete search history.

(56) References Cited

U.S. PATENT DOCUMENTS

| | | |
|---|---|---|
| 2008/0308792 A1 | 12/2008 | Takahashi |
| 2019/0019974 A1 | 1/2019 | Yun et al. |

| | | | |
|---|---|---|---|
| 2021/0028327 A1 | 1/2021 | Lin et al. | |
| 2021/0217816 A1 | 7/2021 | Ha et al. | |
| 2021/0359011 A1 | 11/2021 | Lee | |
| 2021/0399260 A1 | 12/2021 | Kim et al. | |
| 2022/0199694 A1* | 6/2022 | Bae | H10K 59/8792 |
| 2022/0393122 A1 | 12/2022 | Liu et al. | |
| 2023/0005898 A1* | 1/2023 | Lee | H01L 25/0753 |
| 2023/0016588 A1* | 1/2023 | Park | H10K 85/342 |
| 2023/0044364 A1* | 2/2023 | Bae | H10H 20/857 |

(Continued)

FOREIGN PATENT DOCUMENTS

| | | | | |
|---|---|---|---|---|
| CN | 112992995 A | 6/2021 | | |
| CN | 115377140 A * | 11/2022 | | G02B 5/201 |

(Continued)

OTHER PUBLICATIONS

1 European Search Report for EP 23163945.1 dated Jul. 30, 2024.

(Continued)

*Primary Examiner* — Michael Lebentritt
(74) *Attorney, Agent, or Firm* — CANTOR COLBURN LLP

(57) ABSTRACT

A color conversion substrate includes a base substrate, a color filter layer on the base substrate, a low refractive index layer on the color filter layer, a capping layer on the low refractive index layer, where the capping layer includes a first capping film including silicon oxynitride (SiOxNy) having a nitrogen content in a range of about 10 at % to about 35 at %, a bank on the capping layer, where an opening defining a plurality of pixels is defined in the bank, and a color conversion layer on the capping layer in the opening.

32 Claims, 22 Drawing Sheets

(56) References Cited

U.S. PATENT DOCUMENTS

| | | | | |
|---|---|---|---|---|
| 2023/0130149 A1 * | 4/2023 | Lee | ..................... | H01L 25/167 |
| | | | | 257/91 |
| 2023/0148430 A1 * | 5/2023 | Kim | .................... | H10H 29/142 |
| | | | | 257/89 |

FOREIGN PATENT DOCUMENTS

| | | | | | | |
|---|---|---|---|---|---|---|
| EP | 3654383 | A1 | * | 5/2020 | .......... | H01L 27/3211 |
| EP | 3690971 | A1 | * | 8/2020 | ........... | H01L 27/322 |
| EP | 4089730 | A1 | * | 11/2022 | ............. | H01L 24/24 |
| EP | 4181651 | A1 | * | 5/2023 | ......... | H01L 27/3246 |
| KR | 1020180073502 | A | | 7/2018 | | |
| KR | 1020200100513 | A | | 8/2020 | | |
| KR | 102321892 | B1 | | 11/2021 | | |
| KR | 1020220000388 | A | | 1/2022 | | |
| KR | 20230050519 | A | * | 4/2023 | | |

OTHER PUBLICATIONS

Extended European Search Report for Application No. 23163945.
1-1212 dated Jul. 18, 2023. enumerating the above listed references.

* cited by examiner

OP:OP1,OP2,OP3

OP:OP1,OP2,OP3

OP:OP1,OP2,OP3

OP:OP1,OP2,OP3

OP:OP1,OP2,OP3

OP:OP1,OP2,OP3

OP:OP1,OP2,OP3

OP:OP1,OP2,OP3

OP:OP1,OP2,OP3

OP:OP1,OP2,OP3

OP2  CCL2  DOP

BK

OP1  CCL1        OP3 TL

OP:OP1,OP2,OP3

OP2 CCL2  DOP

BK

OP1  CCL1        OP3 TL

COLOR CONVERSION SUBSTRATE, DISPLAY DEVICE INCLUDING THE SAME, AND METHOD OF MANUFACTURING COLOR CONVERSION SUBSTRATE

This application claims priority to Korean Patent Application No. 10-2022-0073510, filed on Jun. 16, 2022, and all the benefits accruing therefrom under 35 U.S.C. § 119, the content of which in its entirety is herein incorporated by reference.

BACKGROUND

1. Field

Embodiments relate to a display device. More particularly, embodiments relate to a color conversion substrate, a display device including the color conversion substrate, and a method of manufacturing the color conversion substrate.

2. Description of the Related Art

The display device is a device that displays an image for providing visual information to a user. Representative examples of such display device include a liquid crystal display device and an organic light emitting display device.

Recently, a display device including a display substrate including a plurality of pixels and a color conversion substrate including a color filter layer and a color conversion layer has been proposed to improve display quality. The color conversion layer may convert a wavelength of light provided from the display substrate. Accordingly, the display device including the color conversion layer may emit light having a color different from that of the incident light. For example, the color conversion layer may include wavelength conversion particles such as quantum dots.

SUMMARY

Embodiment provides a color conversion substrate with improved reliability.

Another embodiment provides a display device including the color conversion substrate.

Still another embodiment provides a method of manufacturing the color conversion substrate.

A color conversion substrate according to an embodiment includes a base substrate, a color filter layer on the base substrate, a low refractive index layer on the color filter layer, a capping layer on the low refractive index layer, where the capping layer includes a first capping film including silicon oxynitride (SiOxNy) having a nitrogen content in a range of about 10 atomic percent (at %) to about 35 at %, a bank on the capping layer, where an opening defining a plurality of pixels is defined in the bank, and a color conversion layer on the capping layer in the opening.

In an embodiment, a silicon content included in the silicon oxynitride included in the first capping film may be in a range of about 40 at % to about 50 at %.

In an embodiment, an oxygen content included in the silicon oxynitride included in the first capping film may be in a range of about 20 at % to about 50 at %.

In an embodiment, a thickness of the first capping film may be in a range of about 2000 angstrom (Å) to about 5000 Å.

In an embodiment, the capping layer may further include a second capping film including a material different from a material of the first capping film.

In an embodiment, the second capping film may include at least one organic film or at least one inorganic film.

In an embodiment, a thickness of the capping layer may be about 10000 Å or less.

In an embodiment, the capping layer may cover the low refractive index layer and surround a side surface of the low refractive index layer.

In an embodiment, the capping layer may be in contact with the side surface of the low refractive index layer.

In an embodiment, the opening may have a shape of one selected from a circle, a triangle, a quadrangle, a pentagon, a hexagon, a heptagon, and an octagon.

In an embodiment, a side surface of the bank defining the opening may be inclined at a taper angle along a thickness direction of the bank.

In an embodiment, the taper angle, which is an angle between an upper surface of the base substrate and the side surface of the bank, may be about 90 degrees or less.

In an embodiment, the color conversion substrate may further include a protective layer disposed on the color conversion layer.

In an embodiment, the protective layer may include silicon oxynitride (SiOxNy), a nitrogen content included in the silicon oxynitride may be in a range of about 10 at % to about at %, a silicon content included in the silicon oxynitride may be in a range of about 40 at % to about 50 at %, and an oxygen content included in the silicon oxynitride may be in a range of about 20 at % to about 50 at %.

In an embodiment, the first capping film may include a first portion adjacent to the low refractive index layer and a second portion on the first portion and spaced apart from the low refractive index layer, and an oxygen content included in the second portion may be greater than an oxygen content included in the first portion.

In an embodiment, a nitrogen content included in silicon oxynitride included in the second portion may be in a range of about 0.2 at % to about 5 at %, a silicon content included in the silicon oxynitride is in a range of about 30 at % to about 40 at %, and an oxygen content included in the silicon oxynitride is in a range of about 50 at % to about 70 at %.

A display device according to an embodiment includes a first base substrate, a second base substrate which faces the first base substrate, a sealing member between the first base substrate and the second base substrate, a color filter layer under the first base substrate, a bank under the color filter layer, where an opening defining a plurality of pixels is defined in the bank, a plurality of light emitting diodes on the second base substrate, where the plurality of light emitting diodes overlaps the plurality of pixels, respectively, a color conversion layer on the plurality of light emitting diodes in the opening, a low refractive index layer under the color filter layer, and on the color conversion layer and the bank, and a capping layer under the low refractive index layer, and on the color conversion layer and the bank, where the capping layer includes a first capping film including silicon oxynitride (SiOxNy) having a nitrogen content in a range of about 10 at % to about 35 at %.

In an embodiment, a silicon content included in the silicon oxynitride included in the first capping film may be in a range of about 40 at % to about 50 at %.

In an embodiment, an oxygen content included in the silicon oxynitride included in the first capping film may be in a range of about 20 at % to about 50 at %.

In an embodiment, the sealing member may be disposed under the color filter layer and the capping layer, and overlap the color filter layer and the capping layer.

In an embodiment, the capping layer may surround a side surface of the low refractive index layer.

A method of manufacturing a color conversion substrate according to an embodiment includes providing a color filter layer on a base substrate, providing a low refractive index layer on the color filter layer, providing a capping layer including silicon oxynitride (SiOxNy) having a nitrogen content in a range of about 10 at % to about 35 at % on the low refractive index layer, providing a bank on the capping layer, forming an opening defining a plurality of pixels by patterning the bank, and providing a color conversion layer on the capping layer in the opening.

In an embodiment, a silicon content included in the silicon oxynitride included in the capping layer may be in a range of about 40 at % to about 50 at %.

In an embodiment, an oxygen content included in the silicon oxynitride included in the capping layer may be in a range of about 20 at % to about 50 at %.

In an embodiment, the providing the capping layer may include performing a deposition process.

In an embodiment, a process gas of the deposition process includes hydrogen ($H_2$) gas, silane ($SiH_4$) gas, ammonia ($NH_3$) gas, nitrous oxide ($N_2O$) gas, or nitrogen ($N_2$) gas.

In an embodiment, when the opening is formed by patterning the bank, a side surface of the bank defining the opening may be formed to be inclined at a taper angle along a thickness direction of the bank.

In an embodiment, the taper angle, which is an angle between an upper surface of the base substrate and the side surface of the bank, may be about 90 degrees or less.

In an embodiment, when the opening is formed by patterning the bank, the opening may be formed to have a shape of one selected from a circle, a triangle, a quadrangle, a pentagon, a hexagon, a heptagon, and an octagon.

In an embodiment, the capping layer may include a first portion adjacent to the low refractive index layer and a second portion on the first portion and spaced apart from the low refractive index layer, and an oxygen content included in the second portion may be greater than an oxygen content included in the first portion.

In an embodiment, a nitrogen content included in silicon oxynitride included in the second portion may be in a range of about 0.2 at % to about 5 at %, a silicon content included in the silicon oxynitride may be in a range of about 30 at % to about 40 at %, and an oxygen content included in the silicon oxynitride may be in a range of about 50 at % to about 70 at %.

In an embodiment, the method may further include providing a protective layer on the color conversion layer, and the protective layer may include a same material as the capping layer.

In an embodiment, the protective layer may include silicon oxynitride (SiOxNy), a nitrogen content included in the silicon oxynitride may be in a range of about 10 at % to about 35 at %, a silicon content included in the silicon oxynitride may be in a range of about 40 at % to about 50 at %, and an oxygen content included in the silicon oxynitride may be in a range of about 20 at % to about 50 at %.

In a display device according to embodiments of the disclosure, the capping layer includes silicon oxynitride having the nitrogen content of about 10 at % to about 35 at %, the silicon content in a range of about 40 at % to about 50 at %, and the oxygen content in a range of about 20 at % to about 50 at %, such that the manufacturing process of the display device may form Si—N—H bond well, while maintaining the existing (or desired) characteristics of the display device (e.g., luminance, transmittance, and oxidation resistance of the display device). Accordingly, by increasing the Si—N—H bonding, the void space inside the capping layer may be reduced. As a result, the capping layer may effectively prevent foreign materials (e.g., a developer) from penetrating into the low refractive index layer from the upper portion of the capping layer. Thus, a defect in staining of the display device due to residual foreign material may be improved, and reliability of the display device may be improved.

When the capping layer is formed, by providing a large amount of silane gas and ammonia gas and additionally providing hydrogen gas, a Si—N—H bond may be well formed in the capping layer. In addition, since hydrogen is bonded to a dangling bond of silicon (Si), defects in the capping layer may be reduced. Accordingly, by reducing the void space inside the capping layer, the capping layer may effectively prevent penetration of foreign materials from the upper portion of the capping layer into the low refractive index layer.

By forming the taper angle of the side surface of the bank to be about 90 degrees or less, the developer or the like may be effectively prevented from remaining on the lower surface of the opening during the manufacturing process of the opening. In addition, by forming the opening in a shape with a few corners, the developer may be prevented from remaining on the corner of the opening during the manufacturing process of the opening, and the elution of organic material by the remaining developer may be effectively prevented. Accordingly, the reliability of the display device may be improved.

BRIEF DESCRIPTION OF THE DRAWINGS

FIGS. 23 to 38 are views illustrating a method of manufacturing a color conversion substrate according to an embodiment of the disclosure.

DETAILED DESCRIPTION

Figure 1:
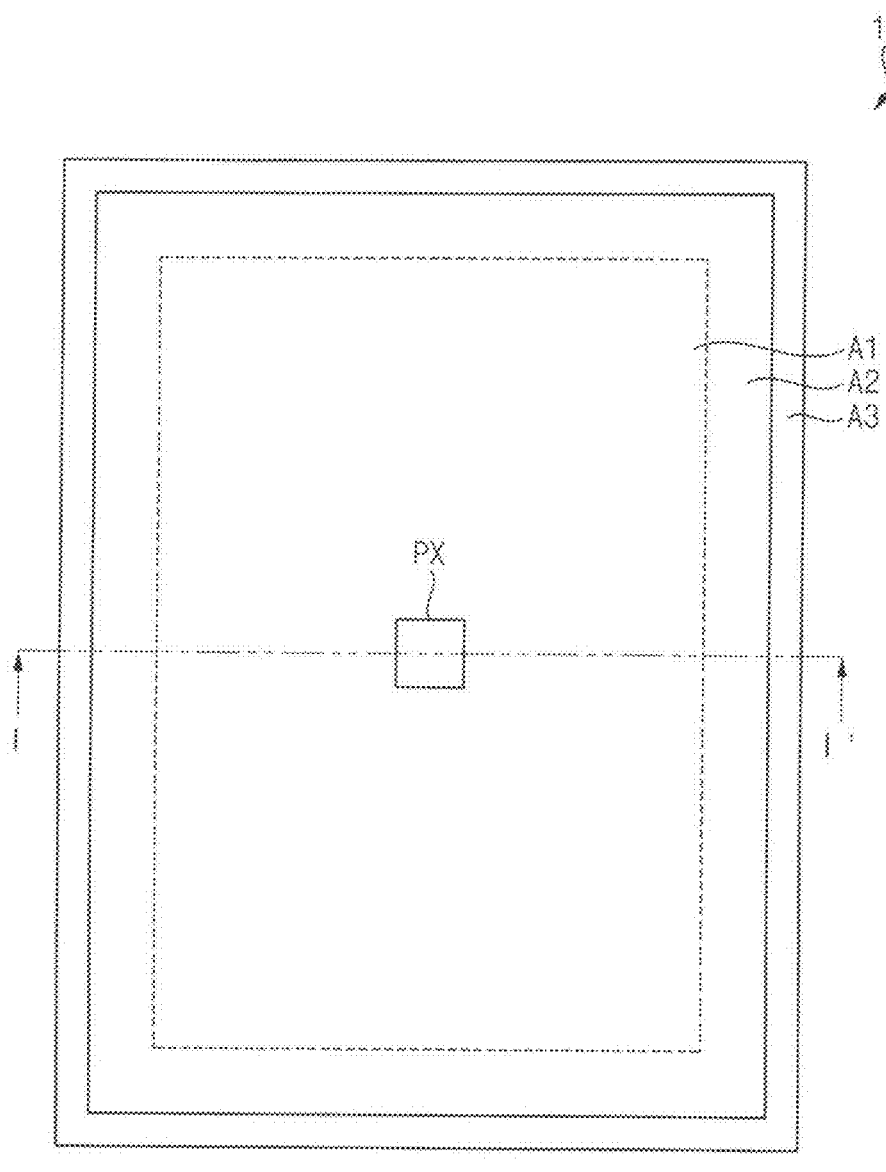
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, display devices in accordance with embodiments will be described in more detail with reference to the accompanying drawings. The same reference numerals are used for the same components in the drawings, and redundant descriptions of the same components will be omitted.

Figure 2:
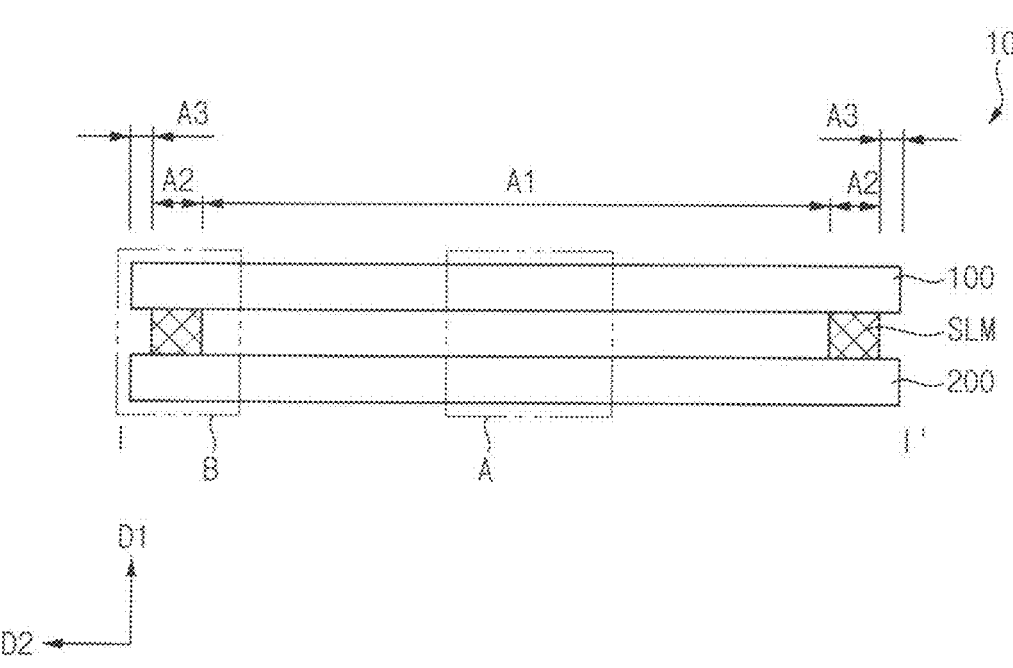
FIG. 2 is a cross-sectional view taken along line I-I' of FIG. 1.

FIG. 1 is a plan view illustrating a display device according to an embodiment. FIG. 2 is a cross-sectional view taken along line I-I' of FIG. 1.

Referring to FIGS. 1 and 2, an embodiment of a display device 10 may include a color conversion substrate 100, a sealing member SLM, and an array substrate 200. The color conversion substrate 100 may face the array substrate 200. The color conversion substrate 100 may be positioned in a first direction D1 from the array substrate 200. In such an embodiment, the first direction D1 may be a front direction of the display device 10 from the array substrate 200. The sealing member SLM may be disposed between the array substrate 200 and the color conversion substrate 100. The sealing member SLM may couple the array substrate 200 and the color conversion substrate 100 to each other.

The display device 10 may include a first area A1 in which an image is displayed, a second area A2 surrounding the first area A1, and a third area A3 surrounding the second area A2. In an embodiment, for example, the first area A1 may be a display area, and the second area A2 and the third area A3 may be a non-display area. In an embodiment, the second area A2 may be a sealing area, and the third area A3 may be an outer area.

Figure 3:
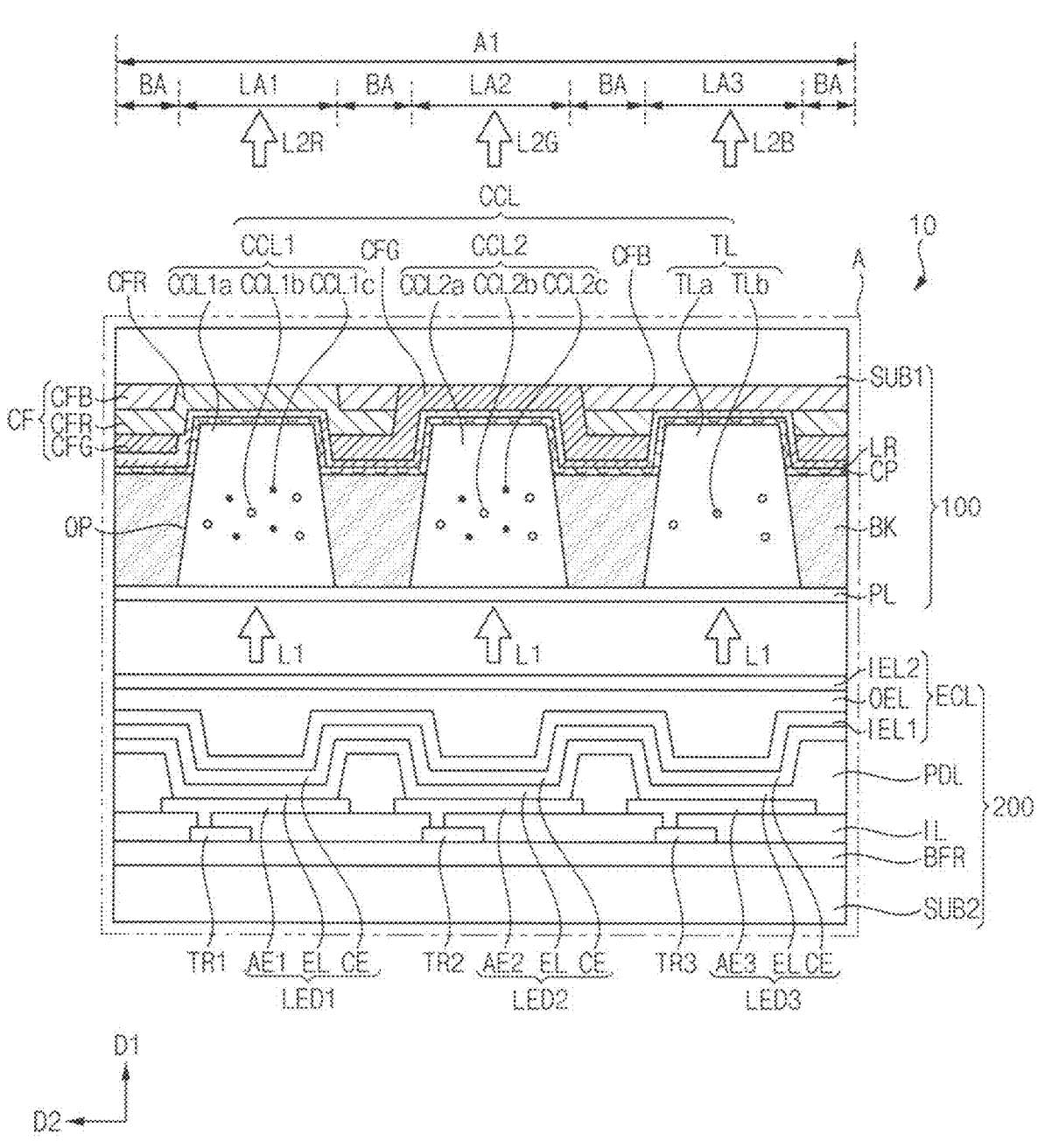
FIG. 3 is an enlarged cross-sectional view of area A of FIG. 2.

The color conversion substrate 100 may include a color conversion layer (e.g., a color conversion layer CCL of FIG. 3). The color conversion layer may be disposed in the first area A1 and may convert a wavelength of light generated from the light emitting diode of the array substrate 200. The color conversion substrate 100 may further include a color filter layer that transmits light of a specific color (e.g., a color filter layer CF of FIG. 3).

The array substrate 200 may include a plurality of pixels PX, and may be referred to as a display substrate. The pixels PX may be disposed in the first area A1 of the array substrate 200. Each of the pixels PX may include a driving element and a light emitting diode. The driving element may include at least one thin film transistor. The light emitting diode may generate light based on a driving signal. In an embodiment, for example, the light emitting diode may be an inorganic light emitting diode or an organic light emitting diode.

The sealing member SLM may be disposed between the array substrate 200 and the color conversion substrate 100, and may be disposed in the second area A2. In an embodiment, for example, the sealing member SLM may be disposed in the second area A2 between the array substrate 200 and the color conversion substrate 100 to surround the first area A1 in a plan view. However, the disclosure is not limited thereto, and alternatively, the sealing member SLM may be disposed in the third area A3, and the second area A2 may be a display area similar to the first area A1.

In an embodiment, for example, the sealing member SLM may have a planar shape of a hollow quadrangle. However, the disclosure is not limited thereto, and alternatively, the sealing member SLM may have various planar shapes depending on the planar shape of the array substrate 200 or the color conversion substrate 100. In an embodiment, for example, where the array substrate 200 or the color conversion substrate 100 has a planar shape such as a triangle, a rhombus, a polygon, a circle, or an oval, the sealing member SLM may be a hollow triangle, a hollow rhombus, a hollow polygon, a hollow circle, or a hollow oval. A filling layer may be disposed between the array substrate 200 and the color conversion substrate 100. In an embodiment, for example, the filling layer may act as a buffer against external pressure applied to the display device 10. In an embodiment, for example, the filling layer may maintain a gap between the array substrate 200 and the color conversion substrate 100. However, the disclosure is not limited thereto.

FIG. 3 is an enlarged cross-sectional view of area A of FIG. 2.

Referring to FIGS. 1 to 3, the first area A1 may include a light emitting area and a light blocking area BA. Light (hereinafter, incident light) L1 generated by the array substrate 200 and incident to the color conversion substrate 100 may be emitted to the outside through the light emitting area. The light emitting area may include first to third light emitting areas LA1, LA2, and LA3 for emitting light of different colors from each other. In an embodiment, for example, a first transmitted light L2R having a first color or a red color may be emitted from the first light emitting area LA1, and a second transmitted light L2G having a second color or a green color may be emitted from the second light emitting area LA2. And a third transmitted light L2B having a third color or a blue color may be emitted from the third light emitting area LA3.

In an embodiment, the first to third light emitting areas LA1, LA2, and LA3 may be spaced apart from each other in the plan view and arranged to repeat each other. The light blocking area BA may surround the first to third light emitting areas LA1, LA2, and LA3 in the plan view. In an embodiment, for example, the light blocking area BA may have a grid shape in the plan view.

In an embodiment, the color conversion substrate 100 may include a first base substrate SUB1, a color filter layer CF, a bank BK, a color conversion layer CCL, a low refractive index layer LR, a capping layer CP, and a protective layer PL.

In an embodiment where the display device 10 includes the first area A1, the second area A2, and the third area A3, the first base substrate SUB1 may include the first area A1, the second area A2, and the third area A3.

The first base substrate SUB1 may be an insulating substrate including or formed of a transparent material. The first base substrate SUB1 may include glass or plastic.

The color filter layer CF may be disposed under the first base substrate SUB1 and may be disposed on the sealing member SLM. In an embodiment, for example, the color filter layer CF may be disposed under the first base substrate SUB1 and overlap the first area A1, the second area A2, and the third area A3. The color filter layer CF may include a red color filter pattern CFR, a green color filter pattern CFG, and a blue color filter pattern CFB.

The red color filter pattern CFR may overlap the first light emitting area LA1 and selectively transmit red light. The green color filter pattern CFG may overlap the second light emitting area LA2 and selectively transmit green light. The blue color filter pattern CFB may overlap the third light emitting area LA3 and selectively transmit blue light.

In an embodiment, each of the red color filter pattern CFR, the green color filter pattern CFG, and the blue color filter pattern CFB may be disposed to further overlap the light blocking area BA. That is, as shown in FIG. 3, the red color filter pattern CFR may overlap the first light-emitting area LA1 and the light-blocking area BA, but may not overlap the second and third light-emitting areas LA2, LA3. The green color filter pattern CFG may overlap the second light-emitting area LA2 and the light-blocking area BA, but may not overlap the first and third light-emitting areas LA1 and LA3. The blue color filter pattern CFB may overlap the third light-emitting area LA3 and the light-blocking area BA, but may not overlap the first and second light-emitting areas LA1 and LA2. In such an embodiment, in the light blocking area BA, portions of the first, second, and third color filter patterns CF1, CF2, and CF3 may overlap each other in the first direction D1. Accordingly, color mixing between the adjacent first to third light emitting areas LA1, LA2, and LA3 may be effectively prevented.

The color filter layer CF may be disposed under the first base substrate SUB1 and selectively further overlap the second area A2 and the third area A3. That is, the color filter layer CF may extend from the first area A1 to the second area A2 and the third area A3.

A portion of the color filter layer CF overlapping the second area A2 and the third area A3 may serve as a light blocking member. In the second area A2 and the third area A3, the green color filter pattern CFG, the red color filter pattern CFR, and the blue color filter pattern CFB may overlap each other in the first direction D1. Accordingly, in the second area A2 and the third area A3, the color filter layer CF may effectively block light from traveling therethrough in the first direction D1.

In an embodiment, for example, in the second area A2 and the third area A3, the blue color filter pattern CFB may be disposed under the first base substrate SUB1, and the red color filter pattern CFR may be disposed under the blue color filter pattern CFB, and the green color filter pattern CFG may be disposed under the red color filter pattern CFR. However, the arrangement order in the embodiments according to the disclosure is not limited thereto.

In the second area A2 and the third area A3, the color filter layer CF may effectively prevent a circuit structure, such as wires and a driving circuit disposed in the second area A2 of the color conversion substrate 100, from being visually recognized from the outside of the display device 10. In addition, the color filter layer CF may effectively prevent a light leakage phenomenon, in which light reflected from the circuit structure or light emitted from the first area A1 is emitted through the second area A2 and the third area A3 of the first base substrate SUB1.

The bank BK may be disposed in the first area A1 under the color filter layer CF. The bank BK may include an opening OP. The opening OP may define the pixels PX. In an embodiment, for example, as shown in FIG. 3, the opening OP of the bank BK may expose the first to third light emitting areas LA1, LA2, and LA3, respectively. In the process of forming the color conversion layer CCL, the bank BK may include forming an opening (e.g., the opening OP of FIG. 11) capable of accommodating an ink composition. In an embodiment, for example, the bank BK may entirely overlap the light blocking area BA and have a grid shape in the plan view.

In an embodiment, the bank BK may include an organic material. In an embodiment, the bank BK may further include a light blocking material. In an embodiment, for example, at least a portion of the bank BK may include a light blocking material such as a black pigment, a dye, or carbon black.

In an embodiment, the low refractive index layer LR may be disposed under the color filter layer CF, and may be disposed on the color conversion layer CCL and the bank BK. The low refractive index layer LR may overlap the first area A1, the second area A2, and the third area A3, and may overlap the sealing member SLM. However, the disclosure is not limited thereto.

The low refractive index layer LR may have a smaller refractive index than the color conversion layer CCL. The low refractive index layer LR may improve light extraction efficiency to increase luminance and lifetime of the display device 10.

The low refractive index layer LR may include an organic material.

The low refractive index layer LR may include hollow particles. The hollow particles may be dispersed in a resin matrix. The hollow particles may include an inorganic material. In an embodiment, for example, the hollow particles may include silica ($SiO_2$), magnesium fluoride ($MgF_2$), iron oxide ($Fe_3O_4$), or a combination thereof. The resin matrix may include an acrylic resin, a siloxane-based resin, a urethane-based resin, an imide-based resin, or the like, and may be selected in consideration of refractive index and manufacturing method.

The low refractive index layer LR may have a metal ion concentration of less than about 1 atomic percent (at %).

The capping layer CP may be disposed under the low refractive index layer LR, and may be disposed on the color conversion layer CCL and the bank BK. In an embodiment, for example, the capping layer CP may cover the low refractive index layer LR. The capping layer CP may be entirely disposed in the first area A1, the second area A2, and the third area A3.

In an embodiment, the capping layer CP may include an inorganic material. In an embodiment, for example, the capping layer CP may include silicon oxynitride (SiOxNy).

The color conversion layer CCL may be disposed in the opening OP. The color conversion layer CCL may be disposed under the capping layer CP and may overlap the first area A1. The color conversion layer CCL may include color conversion parts disposed on a lower surface of the capping layer CP to be spaced apart from each other. In an embodiment, the color conversion layer CCL may include a first color conversion part CCL1, a second color conversion part CCL2, and a transmission part TL. The first color conversion part CCL1, the second color conversion part CCL2, and the transmission part TL may be disposed in the first area A1 under the color filter layer CF, and overlap the first to third light emitting areas LA1, LA2, and LA3, respectively. In an embodiment, for example, the first color conversion part CCL1, the second color conversion part CCL2, and the transmission part TL may be respectively disposed in the opening OP of the bank BK.

The first color conversion part CCL1 may overlap the first light emitting area LA1. The first color conversion part CCL1 may convert the incident light L1 into the first transmitted light L2R having the red color. In an embodiment, for example, the first color conversion part CCL1 may include a resin part CCL1a, a scatterer CCL1b, and wavelength conversion particles CCL1c.

The scatterer CCL1b may scatter the incident light L1 to increase a light path without substantially changing the wavelength of the incident light L1 incident on the first color conversion part CCL1. The scatterer CCL1b may include a metal oxide or an organic material. Alternatively, the scatterer CCL1b may be omitted.

In an embodiment, the wavelength conversion particles CCL1c may include quantum dots. The quantum dots may be defined as semiconductor materials having nanocrystals. The quantum dots have a specific bandgap depending on the composition and size. Accordingly, the quantum dots may absorb the incident light L1 and emit light having a wavelength different from that of the incident light L1. In an embodiment, for example, the quantum dots may have a diameter of about 100 nanometers (nm) or less, e.g., in a range of about 1 nm to about 20 nm, in diameter. In an embodiment, for example, the wavelength conversion particles CCL1c of the first color conversion part CCL1 may include quantum dots that absorb the incident light L1 and emit red light.

The scatterer CCL1b and the wavelength conversion particle CCL1c may be disposed in the resin part CCL1a. In an embodiment, for example, the resin part CCL1a may include an epoxy-based resin, an acrylic resin, a phenol-based resin, a melamine-based resin, a cardo-based resin, or an imide-based resin.

The first color conversion part CCL1 may convert the incident light L1 to emit the first transmitted light L2R having the red color. The incident light L1 that is not converted by the first color conversion part CCL1 may be blocked by the red color filter pattern CFR. Accordingly, in the first light emitting area LA1, the first transmitted light L2R having the red color may pass through the first base substrate SUB1 and be emitted to the outside (i.e., in the first direction D1).

The second color conversion part CCL2 may overlap the second light emitting area LA2. The second color conversion part CCL2 may convert the incident light L1 into the second transmitted light L2G having the green color. In an embodiment, for example, the second color conversion part CCL2 may include a resin part CCL2a, a scatterer CCL2b, and wavelength conversion particles CCL2c. The resin part CCL2a and the scatterer CCL2b of the second color conversion part CCL2 may be substantially the same as or similar to the resin part CCL1a and the scatterer CCL1b of the first color conversion part CCL1.

In an embodiment, for example, the wavelength conversion particles CCL2c of the second color conversion part CCL2 may include quantum dots that absorb the incident light L1 and emit green light. Accordingly, the second color conversion part CCL2 may convert the incident light L1 to emit the second transmitted light L2G having the green color. The incident light L1 that is not converted by the second color conversion part CCL2 may be blocked by the green color filter pattern CFG. Accordingly, in the second light emitting area LA2, the second transmitted light L2G having green color may pass through the first base substrate SUB1 and be emitted to the outside (i.e., in the first direction D1).

The transmission part TL may overlap the third light emitting area LA3. The transmission part TL may transmit the incident light L1 to emit the third transmitted light L2B. In an embodiment, for example, the transmission part TL may include a resin part TLa and a scatterer TLb. The resin part TLa and the scatterer TLb of the transmission part TL may be substantially the same as or similar to the resin part CCL1a and the scatterer CCL1b of the first color conversion part CCL1.

However, the disclosure is not limited thereto, and in an alternative embodiment, the transmission part TL may convert the incident light L1 into the third transmitted light L2B having the blue color. In such an embodiment, the transmission part TL may further include wavelength conversion particles including quantum dots that absorb the incident light L1 and emit blue light.

A portion of the incident light L1 may be blocked by the blue color filter pattern CFB. Accordingly, in the third light emitting area LA3, the third transmitted light L2B having the blue color may pass through the first base substrate SUB1 and be emitted to the outside (i.e., in the first direction D1).

In the first to third light emitting areas LA1, LA2, and LA3, the first to third transmitted lights L2R, L2G, and L2B emitted to the outside through the first base substrate SUB1 are combined with each other. Accordingly, the image may be displayed in the first area A1.

The protective layer PL may be disposed under the color conversion layer CCL and the bank BK. The protective layer PL may protect the color conversion layer CCL from oxygen, moisture (H$_2$O), foreign materials, and the like. The protective layer PL may be entirely disposed in the first area A1, the second area A2, and the third area A3. In an embodiment, for example, the protective layer PL may cover the capping layer CP, the bank BK, and the color conversion layer CCL, and the protective layer PL may surround a side surface of the capping layer CP (see FIG. 4).

In an embodiment, the protective layer PL may include an inorganic material. In an embodiment, for example, the protective layer PL may include silicon oxide (SiOx), silicon nitride (SiNx), silicon oxynitride (SiOxNy), or the like. These substances may be used alone or in combination.

In an embodiment, the array substrate 200 may include a second base substrate SUB2, a buffer layer BFR, first to third driving elements TR1, TR2, TR3, an insulation layer IL, and a pixel defining layer PDL, first to third light emitting diodes LED1, LED2, LED3, and an encapsulation layer ECL.

The second base substrate SUB2 may face the first base substrate SUB1. In an embodiment where the display device 10 includes the first area A1, the second area A2, and the third area A3, the second base substrate SUB2 may include the first area A1, the second area A2, and the third area A3.

The second base substrate SUB2 may be an insulating substrate including or formed of a transparent or opaque material. In an embodiment, the second base substrate SUB2 may include glass. In such an embodiment, the array substrate 200 may be a rigid display substrate. In an alternative embodiment, the second base substrate SUB2 may include plastic. In such an embodiment, the array substrate 200 may be a flexible display substrate.

The buffer layer BFR may be disposed on the second base substrate SUB2. The buffer layer BFR may effectively prevent impurities such as oxygen and moisture from diffusing onto the second base substrate SUB2 through the second base substrate SUB2. The buffer layer BFR may include an inorganic material such as a silicon compound or a metal oxide. The buffer layer BFR may have a single-layer structure or a multi-layer structure including a plurality of insulation layers.

The first to third driving elements TR1, TR2, and TR3 may be disposed in the first area A1 on the buffer layer BFR. Each of the first to third driving elements TR1, TR2, and TR3 may include at least one thin film transistor. A channel layer of the thin film transistor may include an oxide semiconductor, a silicon semiconductor, an organic semiconductor, or the like. In an embodiment, for example, the oxide semiconductor may include oxide including at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

The insulation layer IL may cover the first to third driving elements TR1, TR2, and TR3. The insulation layer IL may include a combination of an inorganic insulation layer and an organic insulation layer.

The first to third light emitting diodes LED1, LED2, and LED3 may be disposed on the insulation layer IL. In an embodiment, for example, first to third pixel electrodes AE1, AE2, and AE3 may be disposed on the insulation layer IL. Each of the first to third pixel electrodes AE1, AE2, and AE3 may include a conductive material such as a metal, an alloy, a conductive metal nitride, a conductive metal oxide, or a transparent conductive material. Each of the first to third pixel electrodes AE1, AE2, and AE3 may have a single-layer structure or a multi-layer structure including a plurality of conductive layers.

The first to third pixel electrodes AE1, AE2, and AE3 may be electrically connected to the first to third driving elements TR1, TR2, and TR3 through contact holes defined or formed in the insulation layer IL, respectively.

The pixel defining layer PDL may be disposed on the first to third pixel electrodes AE1, AE2, and AE3. The pixel defining layer PDL may include an organic material. The pixel defining layer PDL may define a pixel opening exposing at least a portion of each of the first to third pixel electrodes AE1, AE2, and AE3.

The light emitting layer EL may be disposed on the first to third pixel electrodes AE1, AE2, and AE3 exposed by the pixel opening of the pixel defining layer PDL. In an embodiment, the light emitting layer EL may extend continuously on the first area A1 across a plurality of pixels. In an alternative embodiment, the light emitting layer EL may be separated from the light emitting layer of an adjacent pixel.

The light emitting layer EL may include at least one selected from an organic light emitting material and quantum dots. In an embodiment, the light emitting layer EL may generate blue light. However, embodiments of the disclosure are not limited thereto. In an alternative embodiment, the light emitting layer EL may generate red light or green light, or may generate lights having different colors according to pixels.

In an embodiment, for example, all of the light emitting layers EL may include an organic material for emitting blue light. In such an embodiment, the light emitting layer EL may be formed in or defined by multiple layers, and may have a structure in which a plurality of blue organic light emitting layers are stacked one on another. In an embodiment, for example, the light emitting layer EL may have a structure in which three blue organic light emitting layers are stacked one on another.

However, embodiments according to the disclosure are not limited thereto, and the light emitting layer EL may have a structure in which a plurality of blue organic light emitting layers and an organic light emitting layer emitting light of different colors are stacked. In an embodiment, for example, the light emitting layer EL may have a structure in which three blue organic light emitting layers and one green organic light emitting layer are stacked. In an embodiment, functional layers such as a hole injection layer, a hole transport layer, an electron transport layer, and an electron injection layer may be disposed on the upper and/or lower portions of the light emitting layer EL.

A common electrode CE may be disposed on the light emitting layer EL. The common electrode CE may include a conductive material such as a metal, an alloy, a conductive metal nitride, a conductive metal oxide, or a transparent conductive material. The common electrode CE may have a single-layer structure or a multi-layer structure including a plurality of conductive layers. In an embodiment, the common electrode CE may extend continuously on the first area A1 across a plurality of pixels.

The first pixel electrode AE1, the light emitting layer EL and the common electrode CE may form (or collectively define) the first light emitting diode LED1, and the second pixel electrode AE2, the light emitting layer EL and the common electrode CE may form the second light emitting element LED2, and the third pixel electrode AE3, the light emitting layer EL and the common electrode CE may form the third light emitting element LED3. The light emitting diodes LED1, LED2, and LED3 may overlap the pixels PX defined by the opening OP, respectively. Accordingly, the color conversion layer CCL may be disposed on the light emitting diodes LED1, LED2, and LED3.

The encapsulation layer ECL may be disposed on the common electrode CE. The encapsulation layer ECL may include at least one inorganic encapsulation layer and at least one organic encapsulation layer. In an embodiment, the encapsulation layer ECL may include a first inorganic encapsulation layer IEL1 disposed on the common electrode CE, and an organic encapsulation layer OEL disposed on the first inorganic encapsulation layer IEL1, and a second inorganic encapsulation layer IEL2 disposed on the organic encapsulation layer OEL.

In an embodiment, a dam DM may be disposed in the second area A2 on the second base substrate SUB2. In an embodiment, for example, the dam DM may surround the first area A1 in the plan view. The dam DM may prevent the organic material from overflowing to the outside of the dam DM (e.g., in the second direction D2) during the formation of the organic encapsulation layer OEL.

The dam DM may be formed in one or a plurality of layers. The dam DM may be formed as a single-layer defined by a single organic layer. However, the disclosure is not limited thereto, and the dam DM may be formed as a multi-layer in which a plurality of organic layers are stacked one on another.

Figure 4:
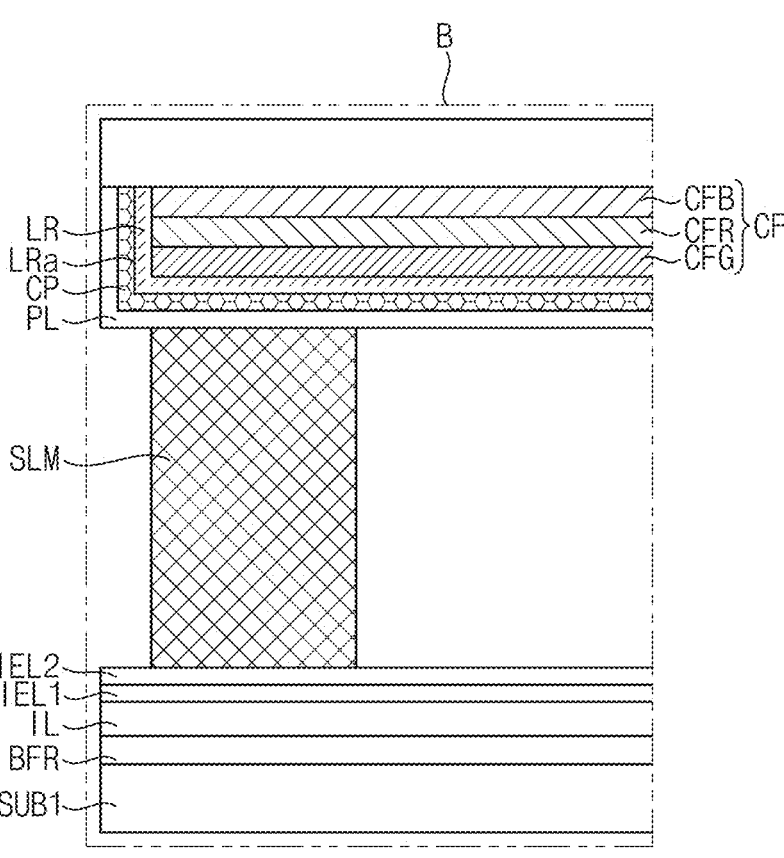
FIG. 4 is an enlarged cross-sectional view of area B of FIG. 2.
Figure 4:
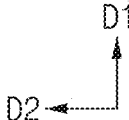

FIG. 4 is an enlarged cross-sectional view of area B of FIG. 2.

Referring to FIG. 4, the sealing member SLM may be disposed under the color filter layer CF and the capping layer CP. The sealing member SLM may overlap the color filter layer CF and the capping layer CP. The capping layer CP may cover the low refractive index layer LR and surround the side surface LRa of the low refractive index layer LR. That is, the capping layer CP may contact the side surface LRa of the low refractive index layer LR. Due to the capping layer CP, the low refractive index layer LR may not be exposed to the outside. Accordingly, the foreign materials may be effectively prevented from penetrating into the display device 10 through the low refractive index layer LR.

However, the disclosure is not limited thereto.

Hereinafter, an embodiment of the color conversion substrate 100 will be described in greater detail with reference to FIGS. 5 to 7.

Figure 5:
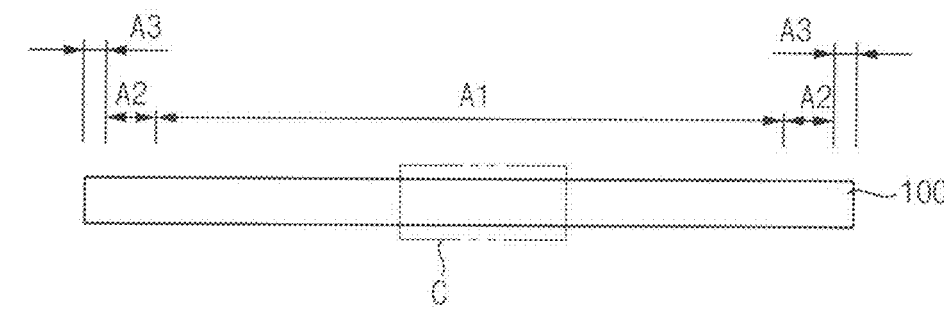
FIG. 5 is a cross-sectional view illustrating a color conversion substrate included in the display device of FIG. 2.
Figure 5:
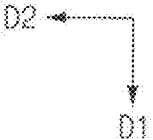

FIG. 5 is a cross-sectional view illustrating a color conversion substrate included in the display device of FIG. 2. FIG. 6 is an enlarged cross-sectional view of area C of FIG. 5.

Particularly, FIG. 5 may be an inverted shape of the color conversion substrate 100 of FIG. 2. Accordingly, the first direction D1 may face downward.

Figure 6:
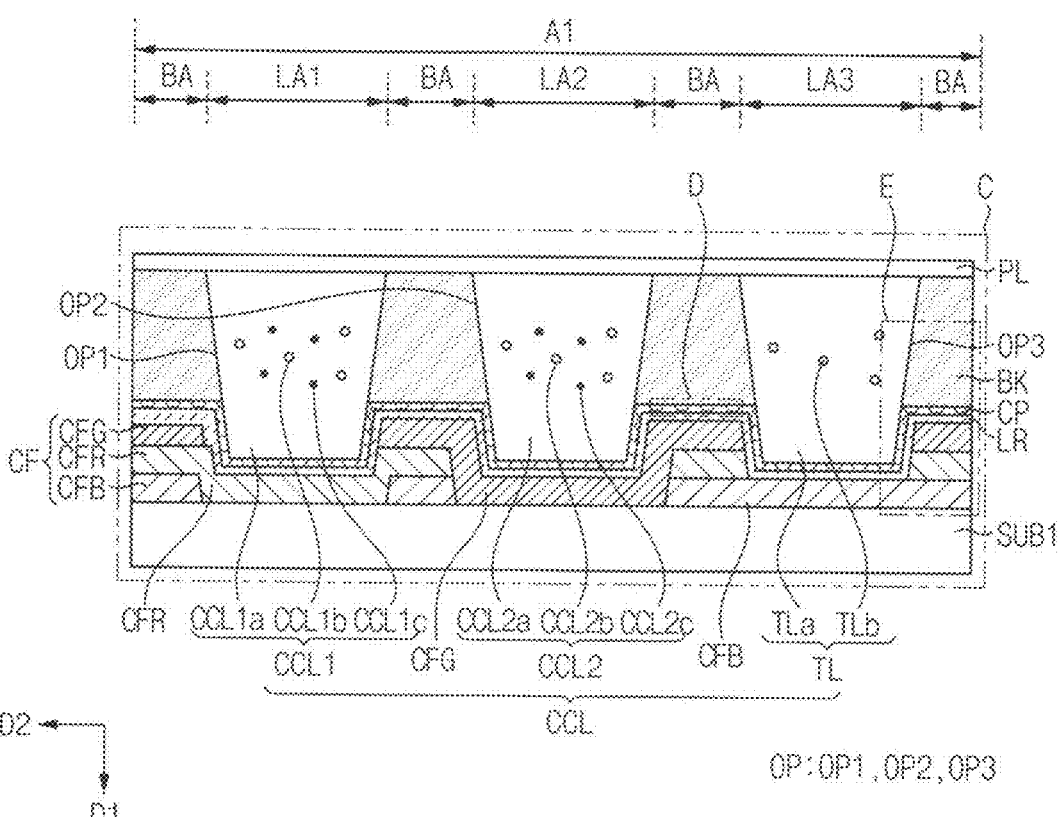
FIG. 6 is an enlarged cross-sectional view of area C of FIG. 5.

Referring to FIGS. 5 and 6, the color conversion substrate 100 may include the first base substrate SUB1, the color filter layer CF, the low refractive index layer LR, the capping layer CP, the bank BK, the color conversion layer CCL, and the protective layer PL.

The color filter layer CF may be disposed on the first base substrate SUB1. The low refractive index layer LR may be disposed on the color filter layer CF, and the low refractive index layer LR may include an organic material.

Figure 7:
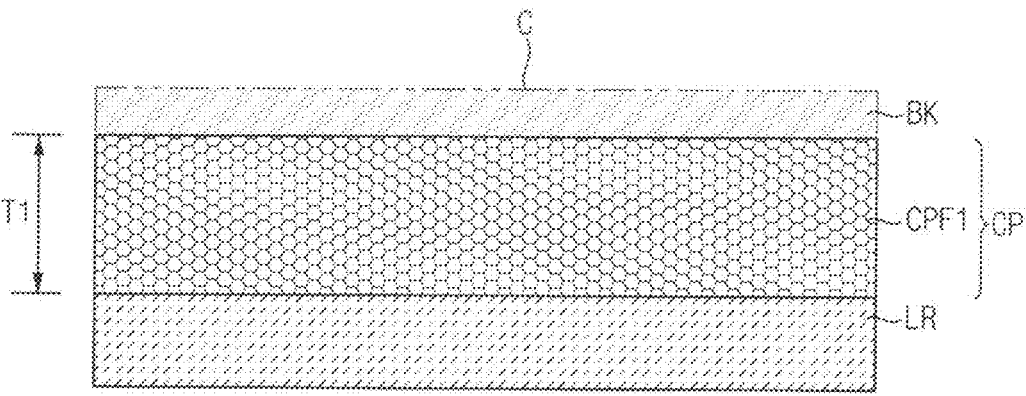
FIG. 7 is an enlarged cross-sectional view of area D of FIG. 6.

FIG. 7 is an enlarged cross-sectional view of area D of FIG. 6.

Referring further to FIG. 7, the capping layer CP may be disposed on the low refractive index layer LR. The capping layer CP may include a first capping layer CPF1. In an embodiment, the capping layer CP may include only the first capping layer CPF1.

However, the disclosure is not limited thereto.

In an embodiment, the first capping layer CPF1 may include silicon oxynitride (SiOxNy). The nitrogen content included in the silicon oxynitride may be in a range of about 10 at % to about 35 at %. In addition, the silicon content included in the silicon oxynitride may be in a range of about 40 at % to about 50 at %. The oxygen content included in the silicon oxynitride may be in a range of about 20 at % to about 50 at %.

If the nitrogen content included in the silicon oxynitride is less than about 10 at %, the Si—N—H bond may not be well formed. Accordingly, a void space inside the first capping layer CPF1 may increase, and thus a plurality of seams may be formed in the first capping layer CPF1. Accordingly, foreign materials may penetrate and remain in the low refractive index layer LR from the upper portion of the first capping layer CPF1 through the seam, and thus the reliability of the display device 10 may be deteriorated.

If the nitrogen content included in the silicon oxynitride is greater than about 35 at %, the desired characteristics of the first capping layer CPF1 may be changed. Accordingly, the luminance or transmittance of the display device 10 may be decreased, and the display device 10 may be oxidized and deformed (reliability is reduced).

If the silicon content included in the silicon oxynitride is less than about 40 at %, the Si—N—H bond may not be well formed. Accordingly, a void space inside the first capping layer CPF1 may increase. That is, a plurality of seams may be formed on the first capping layer CPF1. Accordingly, foreign materials may penetrate into the low refractive index layer LR from an upper portion of the first capping layer CPF1 through the seam, and thus the reliability of the display device 10 may be deteriorated.

If the silicon content included in the silicon oxynitride is greater than about 50 at %, the desired characteristics of the first capping layer CPF1 may be changed. Accordingly, the luminance or transmittance of the display device 10 may be reduced, and the display device may be vulnerable to oxidation and may be deformed.

If the oxygen content included in the silicon oxynitride is less than about 20 at %, the silicon oxynitride may be easily oxidized. Accordingly, the characteristics of the first capping layer CPF1 may change, and accordingly, the reliability of the display device 10 may be deteriorated.

When the oxygen content included in the silicon oxynitride is greater than about 50 at %, the desired characteristics of the first capping layer CPF1 may be changed. Accordingly, the luminance or transmittance of the display device 10 may be reduced, and the display device 10 may be vulnerable to oxidation and may be deformed.

In an embodiment, a thickness T1 of the first capping layer CPF1 may be in a range of about 2000 angstrom (Å) to about 5000 Å. If the thickness T1 of the first capping layer CPF1 is less than about 2000 Å, it may be difficult for the capping layer CP to protect the low refractive index layer LR from the foreign materials. That is, the capping layer CP may not properly perform a capping role.

If the thickness T1 of the first capping layer CPF1 is greater than about 5000 Å, the refractive index or transmittance of the capping layer CP with respect to light may be changed.

Figure 8:
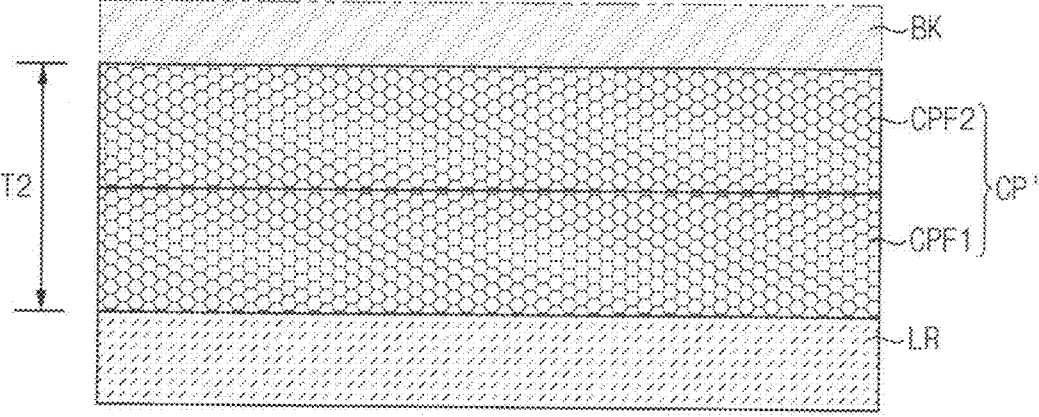
FIG. 8 is a cross-sectional view illustrating an alternative embodiment of FIG. 7.

FIG. 8 is a cross-sectional view illustrating an alternative embodiment of FIG. 7.

Referring to FIG. 8, the capping layer CP' of FIG. 8 may include a first capping layer CPF1 and a capping structure. In an embodiment, the capping structure may be a second capping layer CPF2 disposed on the first capping layer CPF1. However, the disclosure is not limited thereto, and alternatively, the first capping layer CPF1 may be disposed on the second capping layer CPF2.

The second capping layer CPF2 may include a material different from the material of the first capping layer CPF1. The second capping layer CPF2 may include at least one organic layer or at least one inorganic layer.

In an embodiment, for example, the second capping layer CPF2 may be an organic layer including an organic material. In an embodiment, the organic material of the second capping layer CPF2 may include at least one selected from a polyimide-based material, an acrylate-based material, an epoxy-based material, a siloxane-based material, propylene glycol monomethyl etheracetate (PGMEA), poly (methyl methacrylate) (PMMA), poly(melamine-co-formaldehyde) methylated (PMF), PVP-co-PMMA, P(VDF-TrFE), and c-PVP. The above organic materials may be used alone or in combination.

In another embodiment, the second capping layer CPF2 may be an inorganic layer including an inorganic material. In an embodiment, the inorganic material of the second capping layer CPF2 may include at least one selected from SixNy, SixOy, SixOyNz, HfOx, AlxOy, ZrOx, Zr—Al2O3, HfLaO, TiO2, ZAO, p-SiOx, ZnO, In2O3, Ga2O3, InON, ITO, IZO, IGO, ITGO, IGZO, ITGZO, AIZO, and the like. The above inorganic materials may be used alone or in combination.

In an alternative embodiment, the second capping layer CPF2 may include both an organic layer and an inorganic layer, and may have a structure in which the organic layer and the inorganic layer are alternately stacked.

A thickness T2 of the capping layer CP' in the capping layer CP' may be about 1 micrometer ($\mu$m) or less. That is, the combined thickness T2 of the first capping layer CPF1 and the second capping layer CPF2 may be about 1 $\mu$m or less. If the thickness T2 of the capping layer CP' is greater than about 1 $\mu$m, the desired characteristics of the capping layer CP' may be changed. Accordingly, the reliability of the display device 10 may be deteriorated.

Figure 9:
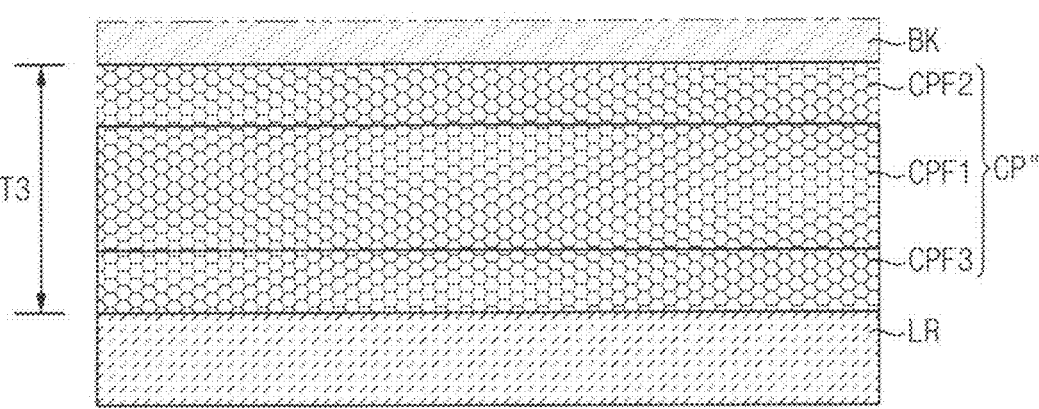
FIG. 9 is a cross-sectional view illustrating another alternative embodiment of FIG. 7.

FIG. 9 is a cross-sectional view illustrating another alternative embodiment of FIG. 7.

Referring to FIG. 9, the capping layer CP of FIG. 9 may include a first capping layer CPF1, a second capping layer CPF2, and a third capping layer CPF3.

The third capping layer CPF3 may be disposed between the first capping layer CPF1 and the low refractive index layer LR. The second capping layer CPF2 may be disposed on the first capping layer CPF1.

The third capping layer CPF3 may include a material different from the material of the first capping layer CPF1. In an embodiment, for example, the third capping layer CPF3 may include a same material as the second capping layer CPF2. The third capping layer CPF3 may include at least one organic layer or at least one inorganic layer. However, the disclosure is not limited thereto.

Similarly, the thickness T3 of the capping layer CP'' may be about 1 $\mu$m or less. That is, a combined thickness T3 of the first capping layer CPF1, the second capping layer CPF2, and the third capping layer CPF3 may be about 1 $\mu$m or less.

Figure 10:
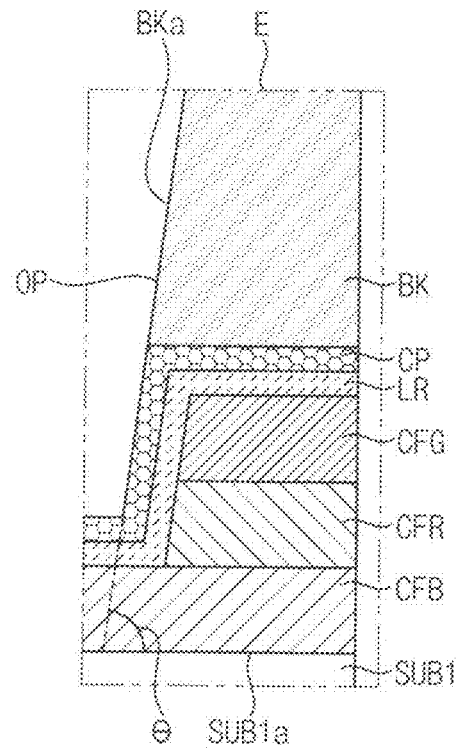
FIG. 10 is an enlarged cross-sectional view of area E of FIG. 6.

FIG. 10 is an enlarged cross-sectional view of area E of FIG. 6.

Referring to FIGS. 6 and 10, the bank BK may be disposed on the capping layer CP. The bank BK may include the opening OP, that is, the opening OP is defined through the bank BK. The opening OP may define the pixels PX.

The bank BK may be formed in a tapered shape. A side surface BKa of the bank BK may be inclined at a certain taper angle $\theta$ along a thickness direction of the bank BK. That is, the taper angle $\theta$ may be an angle between an upper surface SUB1$a$ of the first base substrate SUB1 and the side surface BKa of the bank BK. The taper angle $\theta$ may be about degrees or less. By the side surface BKa of the bank BK having the taper angle $\theta$ of about 90 degrees or less, the developer may be effectively prevented from remaining on the lower surface of the opening OP during the manufacturing process of the opening OP. Accordingly, defects and reliability of the display device 10 may be improved.

The color conversion layer CCL may be disposed on the capping layer CP. The color conversion layer CCL may be disposed in the opening OP.

The protective layer PL may be disposed on the color conversion layer CCL. The protective layer PL may include silicon oxynitride. In an embodiment, the protective layer PL may include a same material as that of the capping layer CP.

In an embodiment, for example, the nitrogen content included in the silicon oxynitride may be in a range of about 10 at % to about 35 at %. In addition, the silicon content included in the silicon oxynitride may be in a range of about 40 at % to about 50 at %. The oxygen content included in the silicon oxynitride may be in a range of about 20 at % to about 50 at %.

In an embodiment where the protective layer PL includes the silicon oxynitride having a nitrogen content of about 10 at % to about 35 at %, the manufacturing process of the display device may form Si—N—H bond and Si—H bond well, while maintaining the existing characteristics of the display device (e.g., luminance, transmittance, and oxidation resistance of the display device). Accordingly, as the Si—N—H and Si—H bonds increase, a void space (e.g., a seam) inside the protective layer PL decreases, so that the protective layer PL may effectively prevent penetration of foreign materials into the color conversion layer CCL from the upper portion of the protective layer PL. Thus, that the reliability of the display device may be improved.

In an embodiment, where the protective layer PL includes the silicon oxynitride having a silicon content of about 40 at % to about 50 at %, the manufacturing process of the display device may form Si—N—H bond and Si—H bond well, while maintaining the existing characteristics of the display device (e.g., luminance, transmittance, and oxidation resistance of the display device). Accordingly, as the Si—N—H and Si—H bonds increase, the void space inside the protective layer PL decreases, so that the protective layer PL may effectively prevent penetration of foreign materials into the color conversion layer CCL from the upper portion of the protective layer PL. Thus, the reliability of the display device 10 may be improved.

In an embodiment, where the protective layer PL includes the silicon oxynitride having an oxygen content in a range of about 20 at % to about 50 at %, the manufacturing process of the display device 10 may prevent oxidation of the protective layer PL, while maintaining the existing characteristics of the display device.

FIGS. 11 to 21 are plan views illustrating a shape of an opening included in a display device according to an embodiment.

Particularly, FIGS. 11 to 21 may be views illustrating the color conversion substrate 100 of FIG. 6 in a plan view.

Referring to FIGS. 11 to 21, in embodiments, an opening OP and a dummy opening DOP may be defined through the bank BK. The opening OP may define the pixels PX. The color conversion layer CCL may be disposed in the opening OP. The dummy opening DOP is disposed adjacent to the opening OP and may surround the opening OP. The dummy opening DOP may accommodate ink that is erroneously deposited when the color conversion layer CCL is manufactured.

The opening OP may have a circular or polygonal shape with 8 angles or less. That is, the opening OP may have one of a circular shape, a triangular shape, a quadrangular shape, a pentagonal shape, a hexagonal shape, a heptagonal shape, and an octagonal shape.

The opening OP may include a first opening OP1 in which the first color conversion part CCL1 is disposed, a second opening OP2 in which the second color conversion part CCL2 is disposed, and third opening OP3 in which the transmission part TL is disposed. The first opening OP1, the second opening OP2, and the third opening OP3 may be arranged to minimize the space between the first opening OP1, the second opening OP2, and the third opening OP3.

Referring to FIGS. 11 to 15, in an embodiment, the third opening OP3 may be spaced apart from the first opening OP1 in a third direction D3. The second opening OP2 may be spaced apart from the first opening OP1 and the third opening OP3 in a fourth direction D4. However, the disclosure is not limited thereto.

In an embodiment, all of the openings OP may have a same shape as each other.

Figure 11:
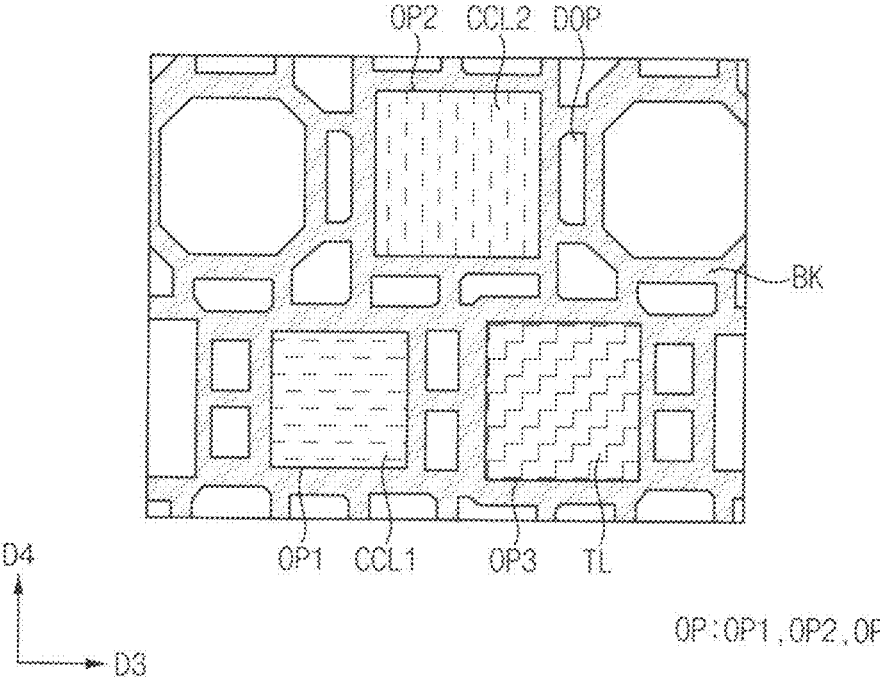
FIGS. 11 to 21 are plan views illustrating a shape of an opening included in a display device according to an embodiment.
Figure 12:
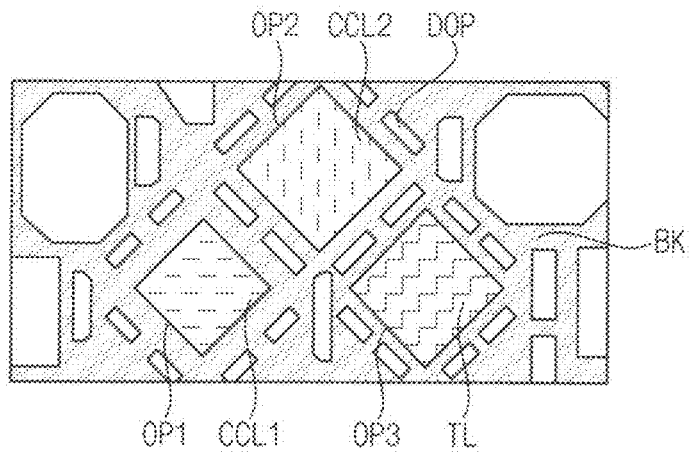
Figure 12:
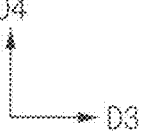
Figure 13:
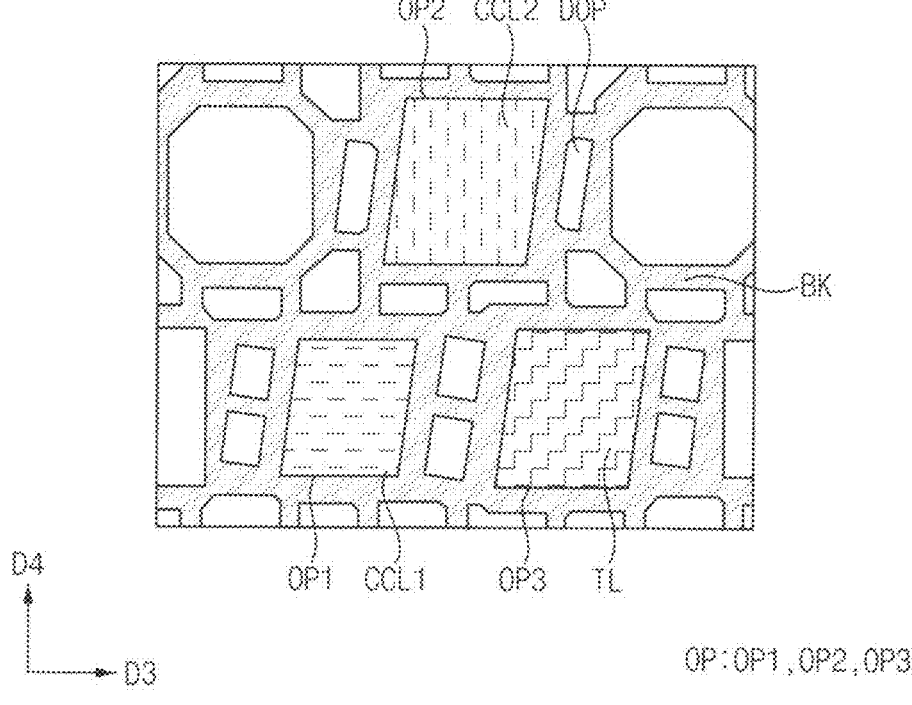

In an embodiment, the opening OP may have the quadrangular shape (refer to FIGS. 11 to 13). The quadrangular shape may be a square or a rectangle (see FIG. 11), the quadrangular shape may be a rhombus (see FIG. 12), or the quadrangular shape may be a parallelogram (see FIG. 13).

Figure 14:
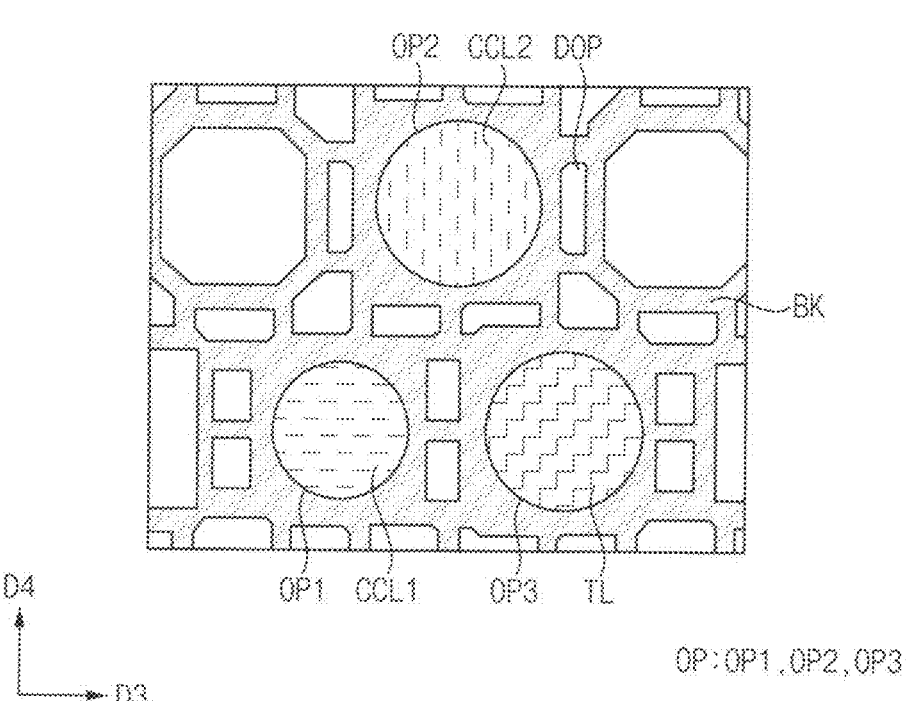

In an alternative embodiment, the opening OP may have a circular shape (refer to FIG. 14). The circle may be a circle or an ellipse.

Figure 15:
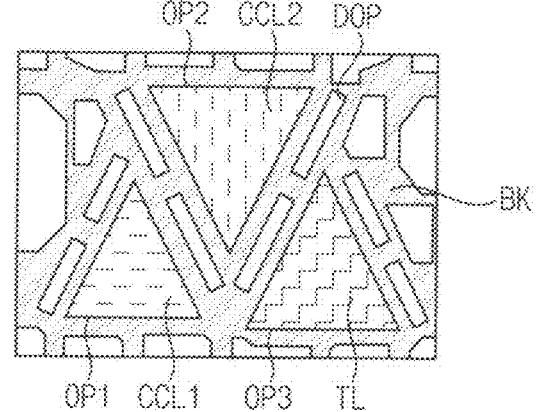
Figure 15:
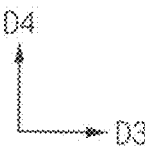

Also, in another alternative embodiment, the opening OP may have a triangular shape (refer to FIG. 15). However, the disclosure is not limited thereto.

Figure 16:
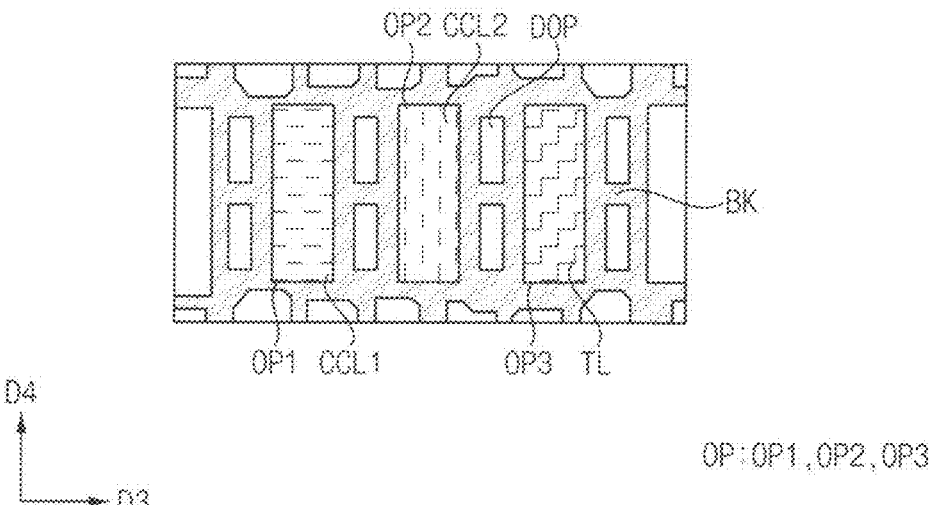
Figure 18:
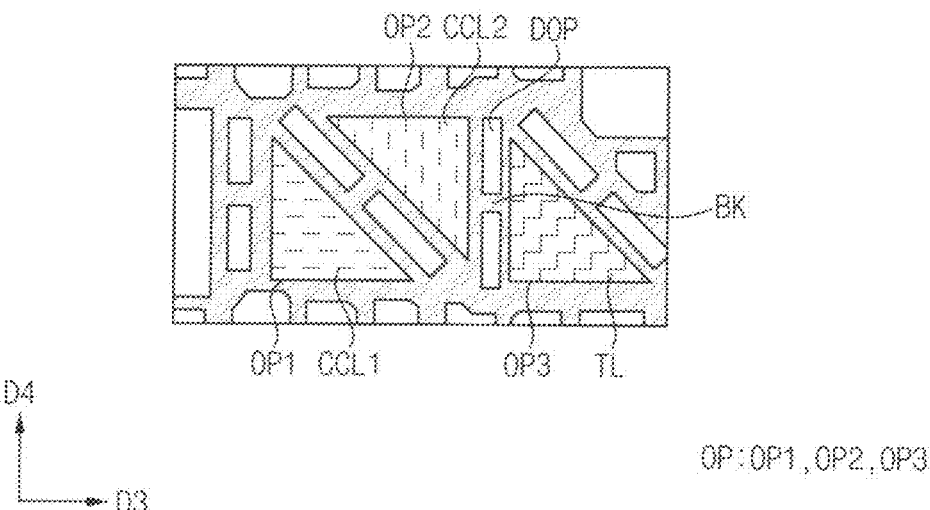

Referring to FIGS. 16 and 18, the opening OP may include a first opening OP1 in which the first color conversion part CCL1 is disposed, and a second opening OP2 in which the second color conversion part CCL2 is disposed, and a third opening OP3 in which the transmission part TL is disposed. The first opening OP1, the second opening OP2, and the third opening OP3 may be sequentially disposed in the third direction D3. However, the disclosure is not limited thereto.

In an embodiment, all of the openings OP may have a same shape as each other.

The opening OP may have a quadrangular shape (refer to FIG. 16). The quadrangular shape may be a square or a rectangle (see FIG. 16), the quadrangular shape may be a rhombus, or the quadrangular shape may be a parallelogram.

Figure 17:
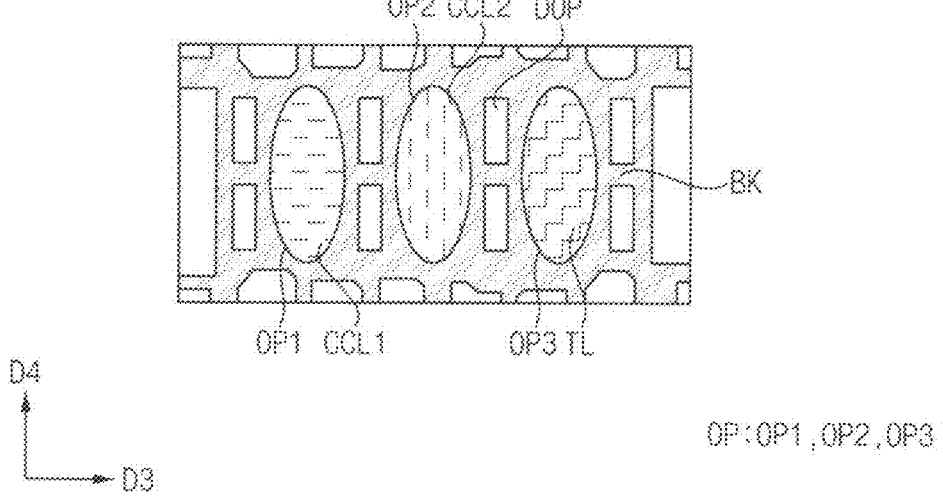

In another alternative embodiment, the opening OP may have a circular shape (see FIG. 17). The circle may be a circle or an ellipse (see FIG. 17).

Also, in another alternative embodiment, the opening OP may have a triangular shape (refer to FIG. 18). However, the disclosure is not limited thereto.

Figure 19:
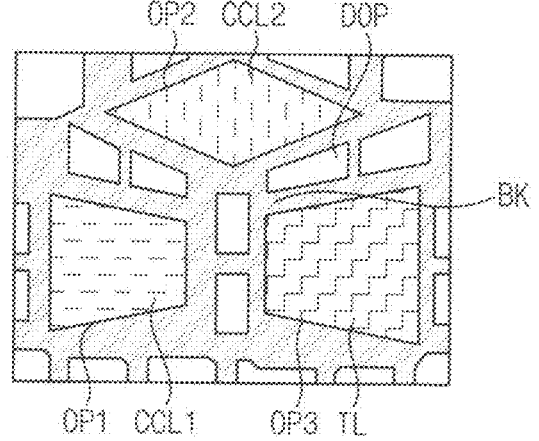
Figure 19:
Figure 20:
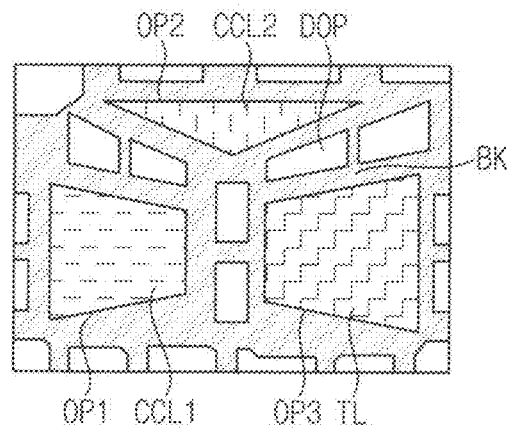
Figure 20:

Referring to FIGS. 19 and 20, the third opening OP3 may be spaced apart from the first opening OP1 in a third direction D3. The second opening OP2 may be spaced apart from the first opening OP1 and the third opening OP3 in a fourth direction D4. However, the disclosure is not limited thereto.

In an embodiment, the opening OP may have different shapes from each other.

Referring to FIG. 19, in an embodiment, the first opening OP1 and the third opening OP3 may have the same shape. The first opening OP1 and the third opening OP3 may have a trapezoidal shape. The second opening OP2 may have a rhombus shape.

Referring to FIG. 20, in an alternative embodiment, the first opening OP1 and the third opening OP3 may have the same shape. The first opening OP1 and the third opening OP3 may have a trapezoidal shape. The second opening OP2 may have a triangular shape.

Figure 21:
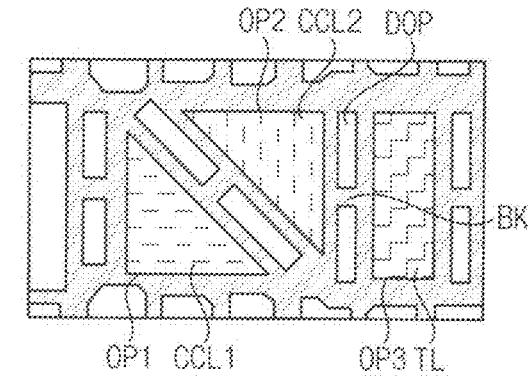
Figure 21:

Referring to FIG. 21, in another alternative embodiment, the first opening OP1, the second opening OP2, and the third opening OP3 may be sequentially disposed in the third direction D3. However, the disclosure is not limited thereto.

In such an embodiment, the first opening OP1 and the second opening OP2 may have a triangular shape. The third opening OP3 may have a quadrangular shape.

However, the disclosure is not limited thereto, and the first opening OP1, the second opening OP2, and the third opening OP3 included in the opening OP may have various arrangements and shapes.

In an embodiment, by forming the opening OP in a shape with a small number of corners, a developer or the like may be effectively prevented from remaining in the corners of the opening OP during the manufacturing process of the opening OP.

Figure 22:
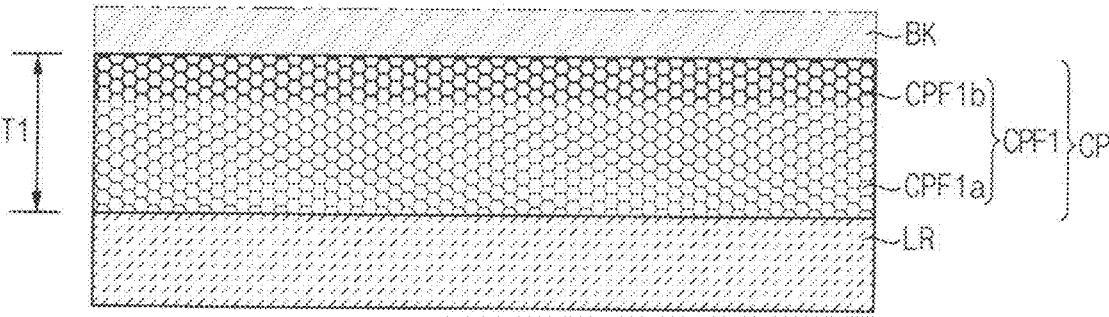
FIG. 22 is a cross-sectional view illustrating another alternative embodiment of FIG. 7.

FIG. 22 is a cross-sectional view illustrating another alternative embodiment of FIG. 7.

Referring to FIG. 22, in an embodiment, the first capping layer CPF1 may include a first portion CPF1a and a capping structure. In an embodiment, the capping structure may be a second portion CPF1b disposed on the first portion CPF1a. The first portion CPF1a may be a portion of the first capping layer CPF1 adjacent to the low refractive index layer LR. The second portion CPF1b may be disposed on the first portion CPF1a and may be spaced apart from the low refractive index layer LR. That is, the second portion CPF1b may be a portion of the first capping layer CPF1 adjacent to the bank BK. The first portion CPF1$a$ and the second portion CPF1$b$ may be connected to each other.

The oxygen content included in the second portion CPF1$b$ may be greater than the oxygen content included in the first portion CPF1$a$. In an embodiment, for example, the nitrogen content included in the silicon oxynitride included in the first portion CPF1$a$ may be in a range of about 10 at % to about 35 at %, and the silicon content included in the silicon oxynitride may be in a range of about 40 at % to about 50 at %, and the oxygen content included in the silicon oxynitride may be in a range of about 20 at % to about 50 at %. The nitrogen content included in the silicon oxynitride included in the second portion CPF1$b$ may be in a range of about 0.2 at % to about 5 at %, and the silicon content included in the silicon oxynitride may be in a range of about 30 at % to about 40 at %, and the oxygen content included in the silicon oxynitride may be in a range of about 50 at % to about 70 at %. That is, the first capping layer CPF1 may include portions having different oxygen contents in a same layer. The first capping layer CPF1 may have partially different oxygen contents (or nitrogen contents, silicon contents).

However, the disclosure is not limited thereto. In an alternative embodiment, the first capping layer CPF1 may include a second portion CPF1$b$ adjacent to the low refractive index layer LR and a first portion CPF1$a$ disposed on the second portion CPF1$b$ and spaced apart from the low refractive index layer LR. Also, in another alternative embodiment, the first capping layer CPF1 may further include a third portion between the low refractive index layer LR and the first portion CPF1$a$. The oxygen content included in the third portion may be greater than the oxygen content included in the first portion CPF1$a$.

Hereinafter, features of embodiments of the disclosure will be further described with reference to Tables 1 and 2.

Comparative Example 1, Example 1, Example 2

After preparing low refractive index layers under the same conditions, each of capping layers according to Comparative Example 1, Example 1, and Example 2 was prepared on each of the low refractive index layers.

The silicon content, nitrogen, and oxygen included in Comparative Examples 1, Example 1, and Example 2 are shown in Table 1 below.

TABLE 1

| | Comparative Example 1 | Example 1 | Example 2 |
|---|---|---|---|
| Silicon (Si) content (at %) | 35.5 | 43.1 | 44.5 |
| Nitrogen (N) content (at %) | 0.4 | 33.9 | 19.1 |
| Oxygen (O) content (at %) | 64.0 | 23.1 | 36.4 |

The characteristics of each of capping layers according to Comparative Examples and Examples are shown in Table 2 below.

TABLE 2

| | | Comparative Example 1 | Example 1 | Example 2 |
|---|---|---|---|---|
| Plasma damage (spins/cm$^2$) | | $4.2 \times 10^{14}$ | $5.6 \times 10^{13}$ | $1.2 \times 10^{14}$ |
| Composition | N/Si | 0.01 | 0.79 | 0.43 |
| Ratio | O/Si | 1.8 | 0.54 | 0.82 |
| Refractive index | | 1.461 | 1.626 | 1.632 |

TABLE 2-continued

| | Comparative Example 1 | Example 1 | Example 2 |
|---|---|---|---|
| Amount of H$_2$ (hydrogen) emission (molec./cm$^3$) | $4.0 \times 10^{19}$ | $6.8 \times 10^{21}$ | $7.6 \times 10^{20}$ |
| Amount of H$_2$O (water) emission (molec./cm$^3$) | $1.7 \times 10^{21}$ | $4.0 \times 10^{20}$ | $8.8 \times 10^{19}$ |
| Roughness (nm) | 2.12 | 1.68 | 1.93 |
| Carbon (C) content (at %) | 4.0 | 6.7 | 6.6 |

Referring to Tables 1 and 2, under the same conditions as described above, in the Examples and Comparative Examples, the plasma damage of the low refractive index layer, the N/Si and O/Si composition ratio of the capping layer, the refractive index of the capping layer, the amount of H$_2$ (hydrogen) emitted from the capping layer, the amount of H$_2$O emitted from the capping layer, the roughness, and the carbon content of the low refractive index layer were measured.

Here, the plasma damage refers to a degree to which the low refractive index layer is damaged due to plasma when the capping layer is formed. The roughness refers to a degree of flatness of the capping layer. The roughness means a value obtained by measuring and averaging lengths between the most protruding portion and the most concave portion of one surface of the capping layer. That is, when the degree of roughness is large, it means that the surface of the capping layer is relatively rough, and it means that the capping layer has a porous structure by increasing a void space inside the capping layer. When the degree of roughness is small, it means that the surface of the capping layer is relatively flat, and it means that the void space (e.g., seam) inside the capping layer is small. The carbon content means the content of carbon included in the upper portion of the low refractive index layer adjacent to the capping layer. When the carbon content is small, it means that the low refractive index layer is relatively damaged.

As shown in Table 2, it can be seen that the plasma damage of the capping layer satisfying Examples 1 and 2 is relatively less than the plasma damage of the capping layer satisfying Comparative Example 1.

In addition, it can be seen that the N/Si composition ratio of the capping layer satisfying Examples 1 and 2 is relatively greater than the N/Si composition ratio of the capping layer satisfying Comparative Example 1. Accordingly, it can be seen that the capping layer satisfying Examples 1 and 2 has a relatively greater nitrogen content than the capping layer satisfying Comparative Example 1. Through this, it can be seen that the capping layer satisfying Example 1 and Example 2 contains relatively more Si—N—H bonds than the capping layer satisfying Comparative Example 1.

Similarly, it can be seen that the O/Si composition ratio of the capping layer satisfying Examples 1 and 2 is relatively less than the O/Si composition ratio of the capping layer satisfying Comparative Example 1. Accordingly, it can be seen that the capping layer satisfying Examples 1 and 2 has a relatively less oxygen content than the capping layer satisfying Comparative Example 1.

It can be seen that the refractive index of the capping layer satisfying Examples 1 and 2 is relatively greater than the refractive index of the capping layer satisfying Comparative Example 1.

It can be seen that the amount of H$_2$ (hydrogen) emission of the capping layer satisfying Examples 1 and 2 is relatively greater than the amount of H$_2$ emission of the capping layer satisfying Comparative Example 1. In the capping layer satisfying Examples 1 and 2, since $H_2$ (hydrogen) gas is provided during the manufacturing process, Si—N—H and Si—H bonds increase, so that the amount of $H_2$ emission of the capping layer satisfying Examples 1 and 2 may be relatively greater than that of the capping layer satisfying Comparative Example 1.

It can be seen that the amount of $H_2O$ emission of the capping layer satisfying Examples 1 and 2 is relatively less than the amount of $H_2O$ emission of the capping layer satisfying Comparative Example 1. Accordingly, since the capping layer satisfying Embodiments 1 and 2 emits relatively less $H_2O$, damage to the display device due to $H_2O$ may be reduced.

It can be seen that the roughness of the capping layer satisfying Examples 1 and 2 is relatively less than the roughness of the capping layer satisfying Comparative Example 1. Accordingly, the capping layer satisfying Examples 1 and 2 may have a relatively flat surface than the capping layer satisfying Comparative Example 1, and may have less void space inside the capping layer. Accordingly, the number of seams of the capping layer satisfying Examples 1 and 2 may be relatively less than that of the capping layer satisfying Comparative Example 1.

It can be seen that the carbon content of the low refractive index layer disposed under the capping layer satisfying Example 1 and Example 2 is greater than the carbon content of the low refractive index layer disposed under the capping layer satisfying Comparative Example 1. Therefore, it can be seen that the low refractive index layer disposed under the capping layer satisfying Examples 1 and 2 is relatively less damaged than the low refractive index layer disposed under the capping layer satisfying Comparative Example 1. have.

Accordingly, as shown in Tables 1 and 2, the display device including the capping layer according to an embodiment of the disclosure may have a relatively high nitrogen content, a relatively high silicon content, and a relatively low oxygen content, the plasma damage by the chemical vapor deposition (CVD) process may be small, the amount of $H_2O$ emission may be small, the void space inside the capping layer may be small, and the degree of damage to the low refractive index layer under the capping layer may be reduced. Accordingly, a defect in staining of the display device may be improved, and reliability of the display device may be improved.

FIGS. 23 to 38 are views illustrating a method of manufacturing a color conversion substrate according to an embodiment of the disclosure.

A method of manufacturing the color conversion substrate described with reference to FIGS. 23 to 38 may be a method of manufacturing the color conversion substrate 100 described with reference to FIGS. 1 to 22. Therefore, any repetitive detailed description of the same or like elements as those described above may be omitted.

Figure 23:
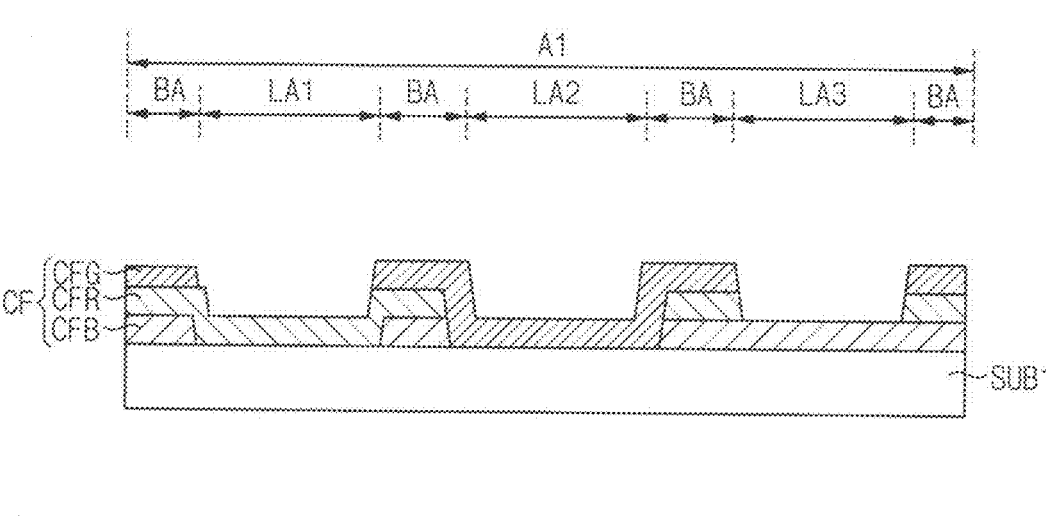
Figure 23:
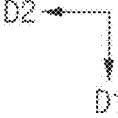

Referring to FIG. 23, a color filter layer CF may be provided or formed in the first area A1 on a first base substrate SUB1. A blue color filter pattern CFB may be provided or formed on the first base substrate SUB1. A red color filter pattern CFR may be provided or formed on the blue color filter pattern CFB. A green color filter pattern CFG may be provided or formed on the red color filter pattern CFR.

The blue color filter pattern CFB may be provided or formed to overlap the third light emitting area LA3 and the light blocking area BA. The red color filter pattern CFR may be provided or formed to overlap the first light emitting area LA1 and the light blocking area BA. The green color filter pattern CFG may be provided or formed to overlap the second light emitting area LA2 and the light blocking area BA.

Figure 24:
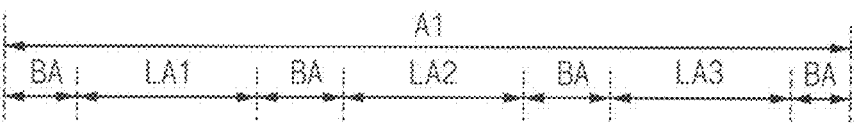
Figure 24:
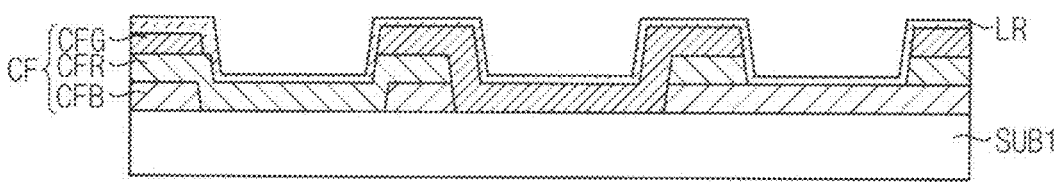
Figure 24:
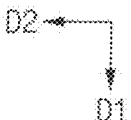

Referring to FIG. 24, a low refractive index layer LR may be provided or formed on the color filter layer CF. The low refractive index layer LR may include or be formed of an organic material.

Figure 25:
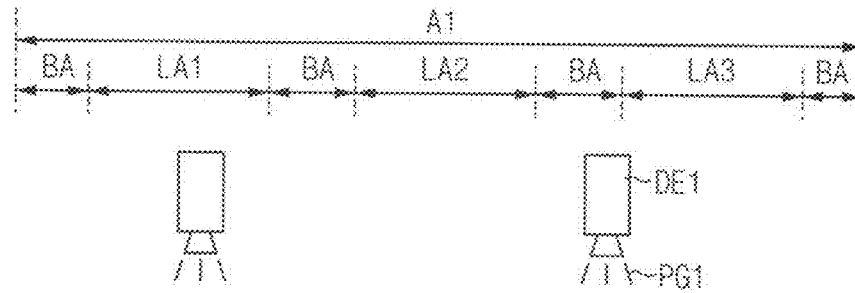
Figure 25:
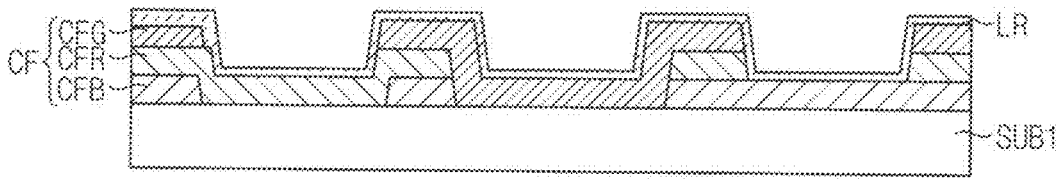
Figure 25:
Figure 26:
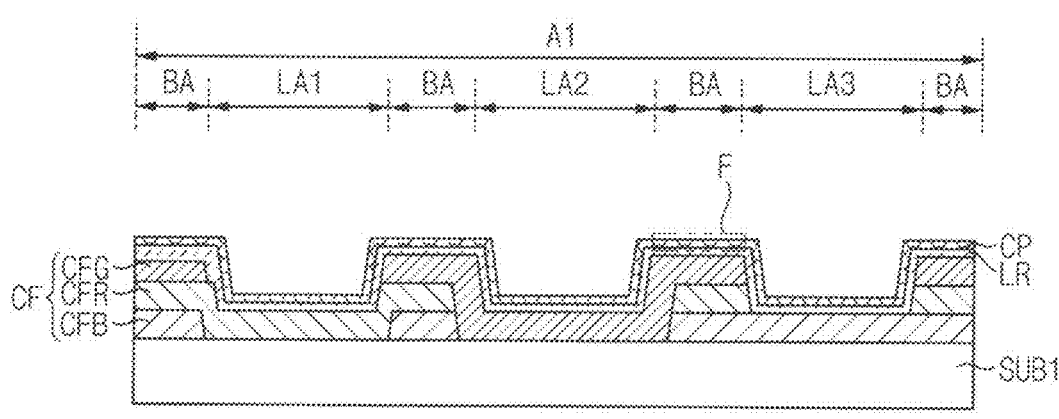
Figure 26:

Referring to FIGS. 25 and 26, a capping layer CP may be provided or formed on the low refractive index layer LR. The capping layer CP may be formed by a deposition process.

In an embodiment, for example, the process of forming the capping layer CP may include providing a process gas PG1 on the low refractive index layer LR. The process gas PG1 may include hydrogen ($H_2$) gas, silane ($SiH_4$) gas, ammonia ($NH_3$) gas, nitrous oxide ($N_2O$) gas, or nitrogen ($N_2$) gas. The process gas PG1 may be deposited on the low refractive index layer LR.

A first deposition apparatus DE1 may provide the process gas PG1 on the low refractive index layer LR and deposit the process gas PG1 on the low refractive index layer LR.

The capping layer CP may include silicon oxynitride formed through the deposition process. The nitrogen content included in the silicon oxynitride may be in a range of about 10 at % to about 35 at %. In addition, the silicon content included in the silicon oxynitride may be in a range of about 40 at % to about 50 at %. In addition, the oxygen content included in the silicon oxynitride may be in a range of about 10 at % to about at %.

When forming the capping layer CP by providing a large amount of the silane gas and the ammonia gas and additionally providing the hydrogen gas, Si—N—H, Si—H bonds may be well formed in the capping layer CP. That is, by additionally providing hydrogen gas, hydrogen may be bonded to a dangling bond of silicon (Si). Therefore, Si—N—H and Si—H bonds may be increased, and thin film defects may be reduced through hydrogen passivation in the silicon oxynitride (SiNxOy) thin film. By reducing the void space (seam) inside the capping layer CP, the capping layer CP may effectively prevent foreign materials from penetrating into the low refractive index layer LR from the upper portion of the capping layer CP.

In an embodiment, when forming the capping layer CP, the process of using hydrogen plasma may be omitted. Accordingly, the low refractive index layer LR may be effectively from being damaged by the plasma. Accordingly, the amount of gas generated from the low refractive index layer LR may be reduced. In addition, as the inner seam of the capping layer CP may be reduced, the gas generated from the low refractive index layer LR may not be emitted to the outside. In addition, since the process of using the hydrogen plasma is omitted, the capping layer CP may be manufactured relatively quickly.

However, the disclosure is not limited thereto. In an alternative embodiment, when forming the capping layer CP, plasma may be used. However, the effect of plasma on the low refractive index layer LR may be reduced by increasing the distance between the first deposition apparatus DE1 and the low refractive index layer LR.

Also, in an alternative embodiment, when the capping layer CP is formed, an intensity of voltage forming the plasma may be reduced.

Accordingly, according to embodiments of the method of manufacturing the capping layer CP described above, the plasma damage of the low refractive index layer LR under the capping layer CP may be reduced.

Figure 27:
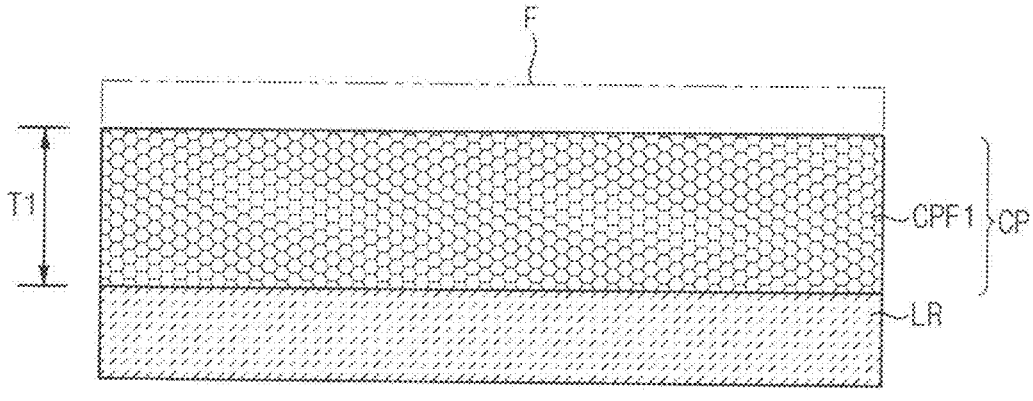

FIG. 27 is an enlarged cross-sectional view of area F of FIG. 26.

Referring to FIG. 27, in an embodiment, the capping layer CP may include only one first capping layer CPF1. A thickness T1 of the first capping layer CPF1 may be in a range of about 2000 Å to about 5000 Å.

Figure 28:
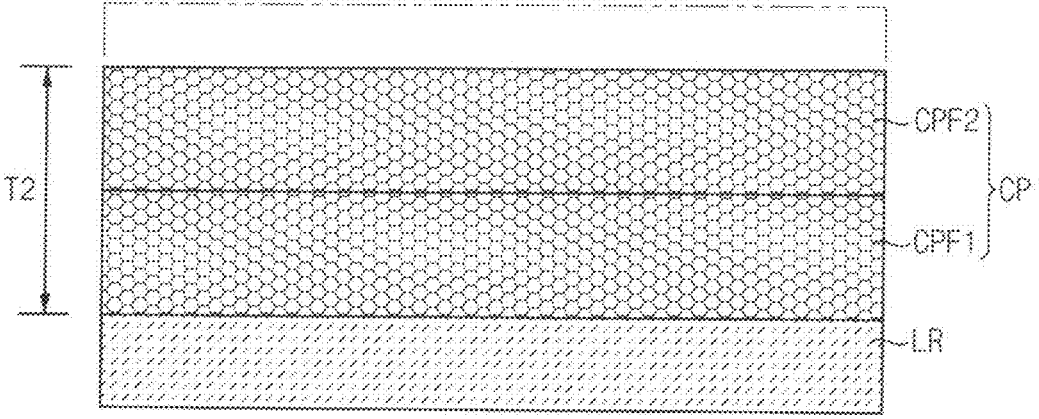

FIG. 28 is a cross-sectional view illustrating an alternative embodiment of FIG. 27.

Referring to FIG. 28, in an alternative embodiment, the capping layer CP may further include a first capping layer CPF1 and a second capping layer CPF2. The first capping layer CPF1 may include or be formed of the silicon oxynitride. The second capping layer CPF2 may include or be formed of a material different from that of the first capping layer CPF1. The second capping layer CPF2 may include or be formed of at least one organic layer or at least one inorganic layer. However, the disclosure is not limited thereto, and the capping layer CP may further include a third capping layer adjacent to the first capping layer CPF1 and the second capping layer CPF2.

A thickness T2 of the capping layer CP' may be about 1 μm or less.

Figure 29:
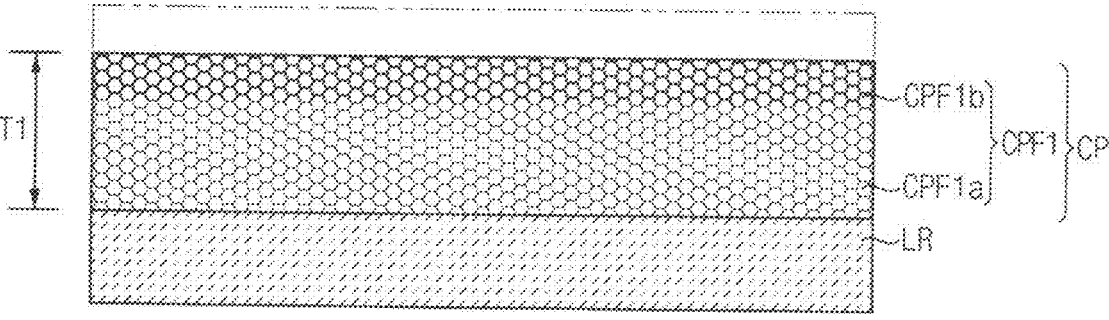

FIG. 29 is a cross-sectional view illustrating another alternative embodiment of FIG. 27.

Referring to FIG. 29, the first capping layer CPF1 may be formed to include a first portion CPF1a and a second portion CPF1b. The first portion CPF1a may be adjacent to the low refractive index layer LR, and the second portion CPF1b may be disposed on the first portion CPF1a and may be spaced apart from the low refractive index layer LR.

The first portion CPF1a and the second portion CPF1b may include or be formed of silicon oxynitride having different content ratios, respectively. The oxygen content included in the second portion CPF1b may be greater than the oxygen content included in the first portion CPF1a. In an embodiment, for example, the nitrogen content included in the silicon oxynitride forming the first portion CPF1a may be in a range of about 10 at % to about at %, and the silicon content may be in a range of about 40 at % to about 50 at %, and the oxygen content may be in a range of about 20 at % to about 50 at %. The nitrogen content included in the silicon oxynitride forming the second portion CPF1b is a in a range of bout at % to about 5 at %, the silicon content is in a range of about 30 at % to about 40 at %, and the oxygen content is in a range of about 50 at % to about 70 at %.

That is, the first capping layer CPF1 may be formed to include portions having different oxygen contents in the same layer.

However, the disclosure is not limited thereto. In an alternative embodiment, the first capping layer CPF1 may be formed to include a second portion CPF1b adjacent to the low refractive index layer LR and a first portion CPF1a disposed on the second portion CPF1b and spaced apart from the low refractive index layer LR. Also, in an alternative embodiment, the first capping layer CPF1 may further include a third portion between the low refractive index layer LR and the first portion CPF1a. The oxygen content included in the third portion may be greater than the oxygen content included in the first portion CPF1a.

Figure 30:
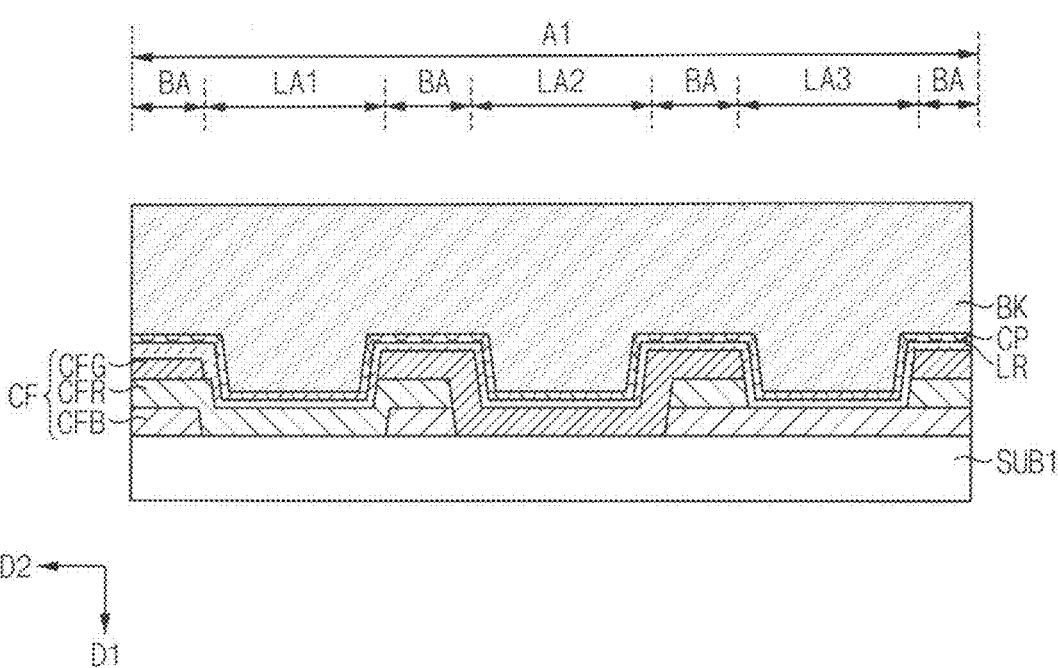
Figure 31:
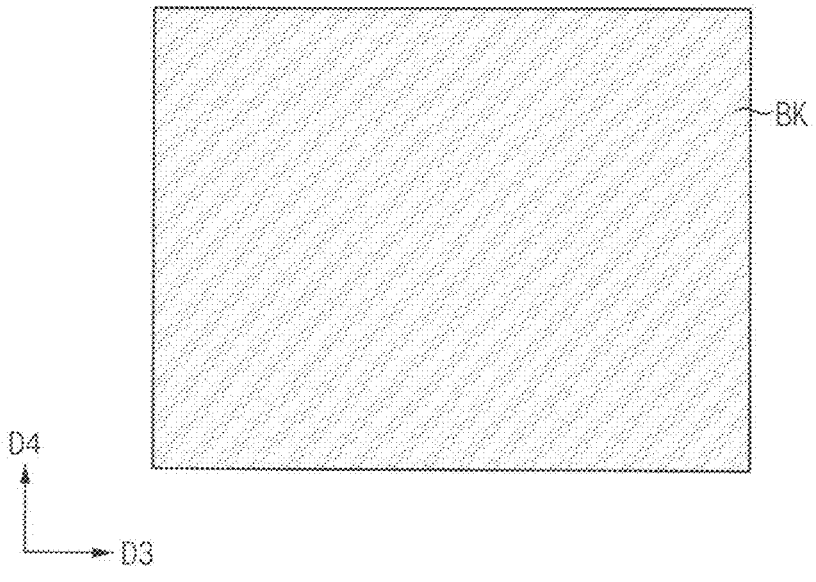

FIG. 31 is a plan view of the bank BK of FIG. 30.

Referring to FIGS. 30 and 31, a bank BK may be provided or formed on the capping layer CP. The bank BK may include or be formed of an organic material. The bank BK may further include a light blocking material.

Figure 32:
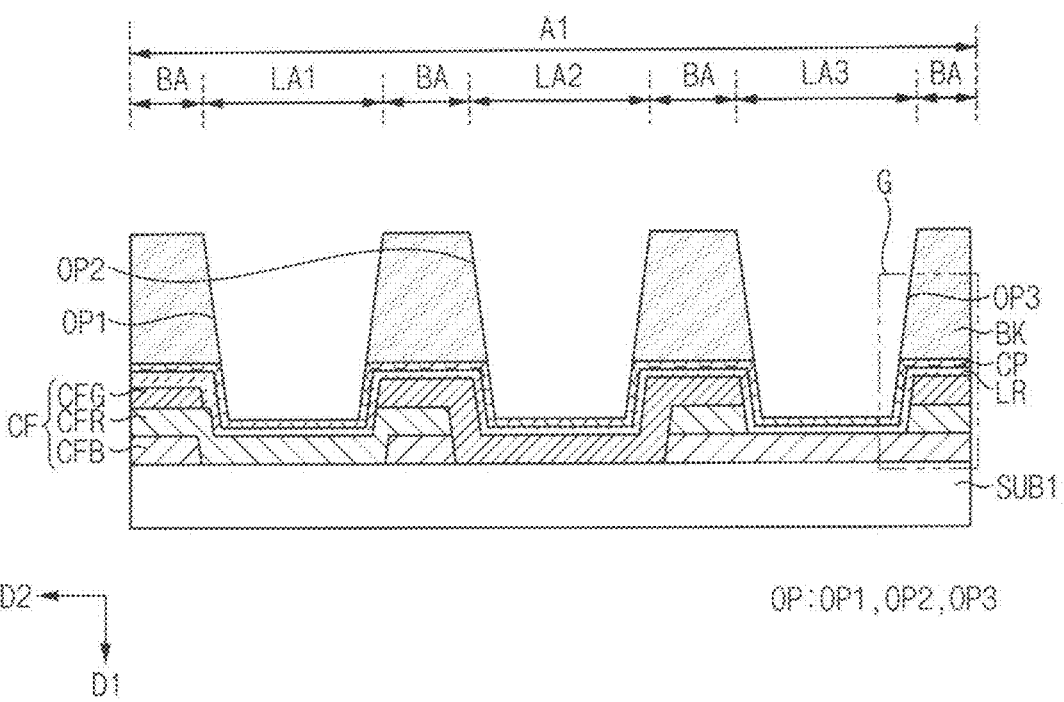
Figure 33:
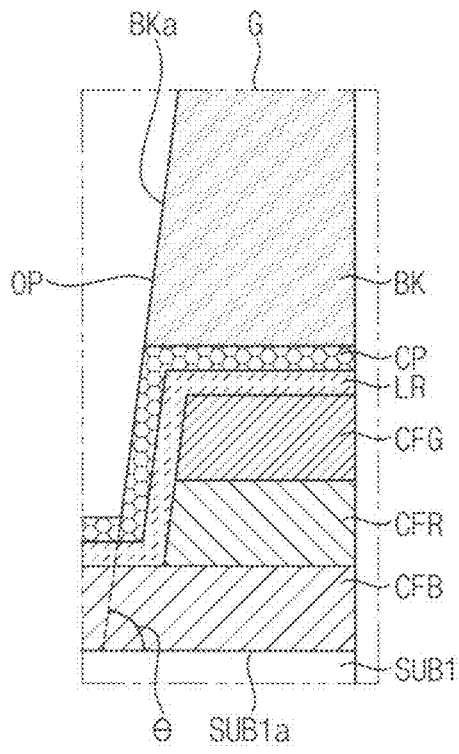
Figure 34:
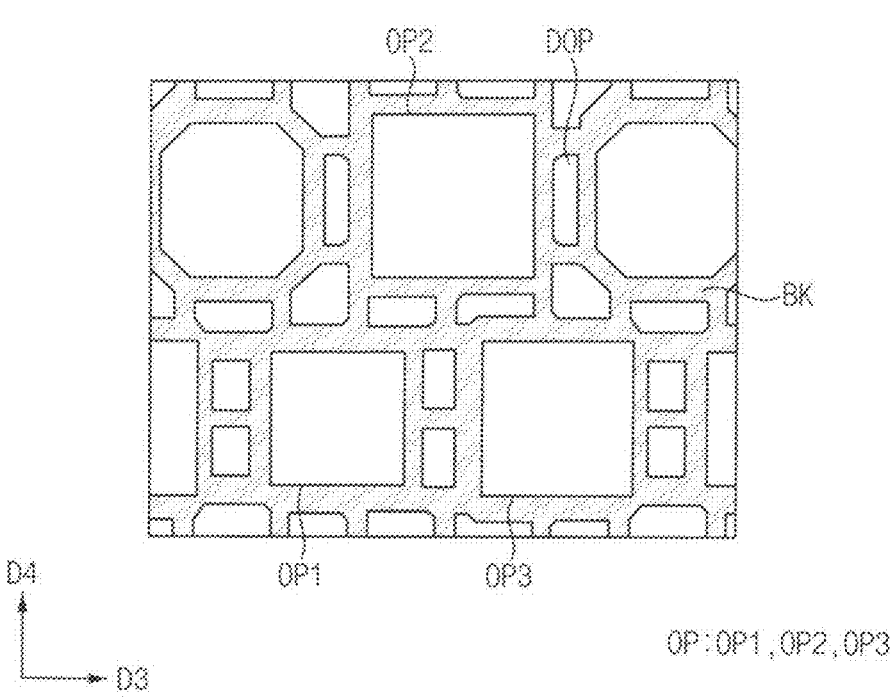

FIG. 33 is an enlarged cross-sectional view of area G of FIG. 32. FIG. 34 is a plan view of the bank BK of FIG. 32.

Referring to FIGS. 32 and 33, the bank BK may be patterned. A photoresist pattern may be formed by coating a photoresist layer on the bank BK, performing an exposure process, and then performing a developing process. The bank BK may be etched using the photoresist pattern. Through such a process, an opening OP and a dummy opening DOP may be formed in the bank BK. The opening OP may be openings defining pixels, and the dummy opening DOP may be openings for accommodating ink erroneous deposition. The dummy opening DOP may be formed to surround the opening OP.

In the patterning process, a side surface BKa of the bank BK defining the opening OP may be formed to form a certain taper angle θ along the thickness direction. The taper angle θ may be an angle between an upper surface SUB1a of the first base substrate SUB1 and the side surface BKa of the bank BK. The taper angle θ may be about 90 degrees or less.

Referring further to FIG. 34, the opening OP may be formed to have one of a circular shape, a triangular shape, a quadrangular shape, a pentagonal shape, a hexagonal shape, a heptagonal shape, and an octagonal shape. In an embodiment, for example, the opening OP may be formed in a quadrangular shape. However, the disclosure is not limited thereto.

Figure 35:
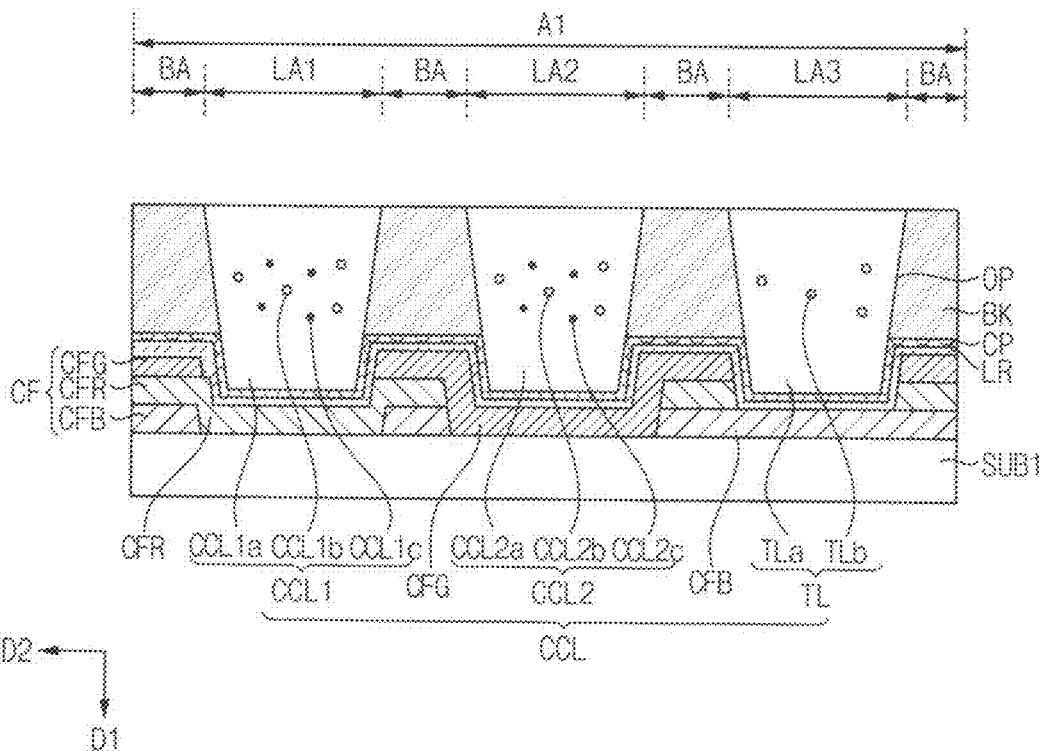
Figure 36:
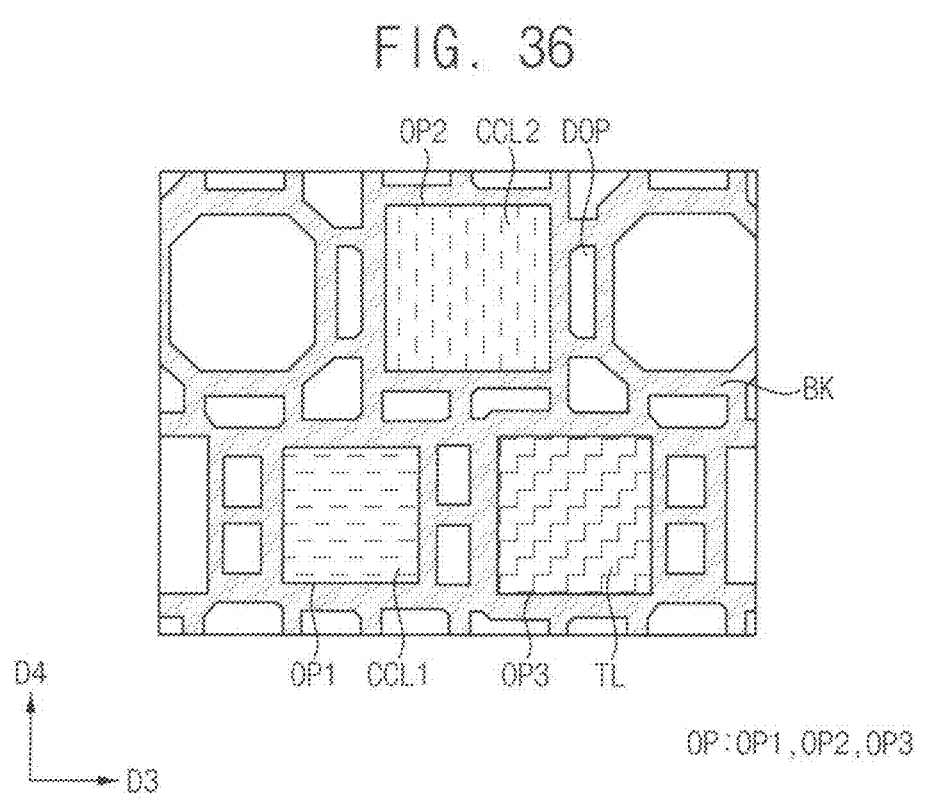

FIG. 36 is a plan view illustrating the bank BK and the color conversion layer CCL of FIG. 35.

Referring to FIGS. 35 and 36, a color conversion layer CCL may be provided or formed in the opening OP. The color conversion layer CCL may be provided or formed on the capping layer CP. The opening OP may include a first opening OP1, a second opening OP2, and a third opening OP3. A first color conversion part CCL1 may be provided or formed in the first opening OP1, a second color conversion part CCL2 may be provided or formed in the second opening OP2, and a transmission part TL may be provided or formed in the third opening OP3.

Figures 37, 38:
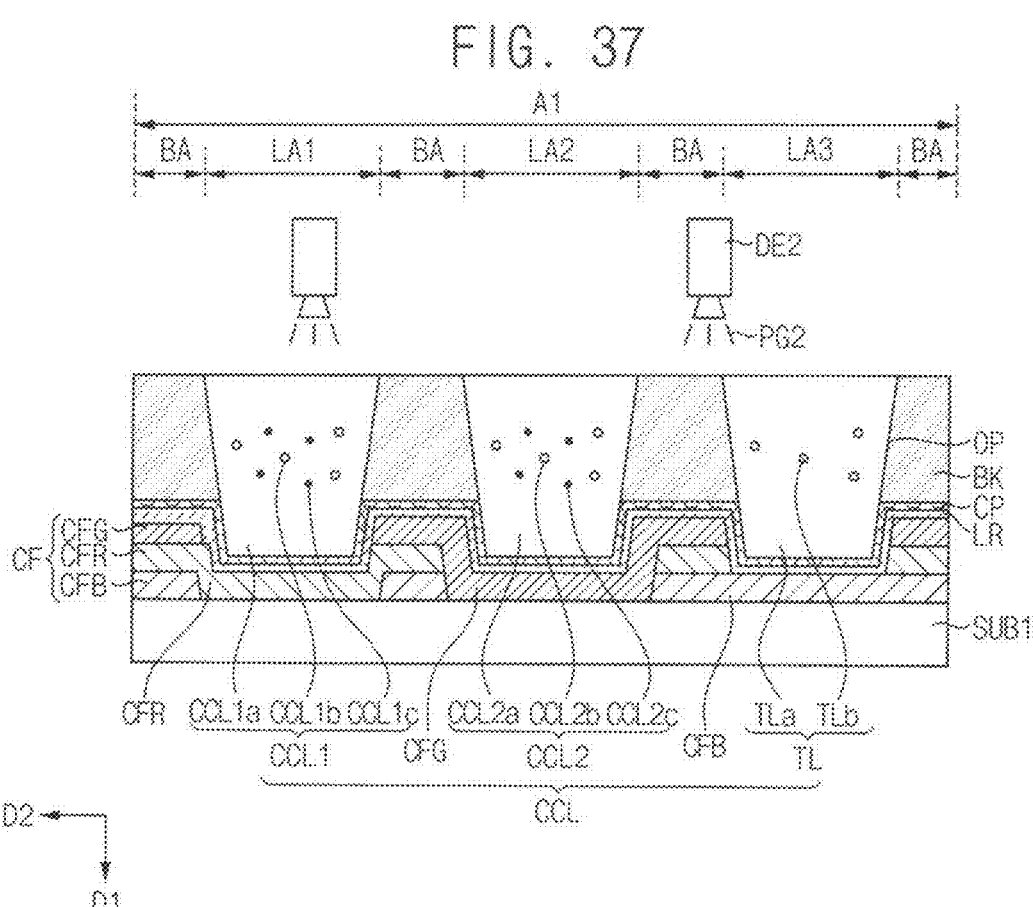

Referring to FIGS. 37 and 38, a protective layer PL may be provided or formed on the color conversion layer CCL and the bank BK. The protective layer PL may be formed by a deposition process.

In an embodiment, for example, the process of forming the protective layer PL may include a process of providing a process gas PG2 on the color conversion layer CCL and the bank BK. The process gas PG2 may include hydrogen ($H_2$) gas, silane ($SiH_4$) gas, ammonia ($NH_3$) gas, nitrous oxide ($N_2O$) gas, or nitrogen ($N_2$) gas. The process gas PG2 may be deposited on the color conversion layer CCL and the bank BK.

The second deposition apparatus DE1 may provide the process gas PG2 on the color conversion layer CCL and the bank BK, and deposit the process gas PG2 on the color conversion layer CCL and the bank BK.

The protective layer PL may include or be formed of a same material as the capping layer CP.

In an embodiment, for example, the protective layer PL may include silicon oxynitride formed through the deposition process. The nitrogen content included in the silicon oxynitride may be in a range of about 10 at % to about 35 at %. In addition, the silicon content included in the silicon oxynitride may be in a range of about 40 at % to about at %. The oxygen content included in the silicon oxynitride may be in a range of about at % to about 50 at %.

When forming the protective layer PL, by providing a large amount of the silane gas and the ammonia gas and additionally providing the hydrogen gas, Si—N—H and Si—H bonds may be well formed in the protective layer PL. Accordingly, the protective layer PL may effectively prevent foreign materials from penetrating into the color conversion layer CCL and the bank BK from the upper portion of the protective layer PL.

When forming the protective layer PL, the above described manufacturing method of the capping layer CP may be applied similarly.

The color conversion substrate and the display device according to embodiments may be applied to a display device included in a computer, a notebook, a mobile phone, a smartphone, a smart pad, a portable media player (PMP), a personal display assistant (PDA), an MP3 player, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A color conversion substrate comprising:
a base substrate;
a color filter layer on the base substrate;
a low refractive index layer on the color filter layer;
a capping layer on the low refractive index layer, wherein the capping layer includes a first capping film including silicon oxynitride (SiOxNy) having a nitrogen content in a range of about 10 at % to about 35 at % and a capping structure on the first capping film and including a material different from a material of the first capping film;
a bank on the capping layer, wherein an opening defining a plurality of pixels is defined in the bank; and
a color conversion layer on the capping layer in the opening,
wherein the first capping film contacts the low refractive index layer and the capping structure contacts the bank.

2. The color conversion substrate of claim 1, wherein a silicon content included in the silicon oxynitride included in the first capping film is in a range of about 40 at % to about 50 at %.

3. The color conversion substrate of claim 1, wherein an oxygen content included in the silicon oxynitride included in the first capping film is in a range of about 20 at % to about 50 at %.

4. The color conversion substrate of claim 2, wherein a thickness of the first capping film is in a range of about 2000 Å to about 5000 Å.

5. The color conversion substrate of claim 2, wherein the capping structure is a second capping film on the first capping film, and the second capping film includes at least one organic film.

6. The color conversion substrate of claim 5, wherein a thickness of the capping layer is about 10000 Å or less.

7. The color conversion substrate of claim 1, wherein the capping layer covers the low refractive index layer and surrounds a side surface of the low refractive index layer.

8. The color conversion substrate of claim 7, wherein the capping layer is in contact with the side surface of the low refractive index layer.

9. The color conversion substrate of claim 1, wherein the opening has a shape of one selected from a circle, a triangle, a quadrangle, a pentagon, a hexagon, a heptagon, and an octagon.

10. The color conversion substrate of claim 1, wherein a side surface of the bank defining the opening is inclined at a taper angle along a thickness direction of the bank.

11. The color conversion substrate of claim 10, wherein the taper angle, which is an angle between an upper surface of the base substrate and the side surface of the bank, is about 90 degrees or less.

12. The color conversion substrate of claim 1, further comprising:
a protective layer disposed on the color conversion layer.

13. The color conversion substrate of claim 12, wherein the protective layer includes silicon oxynitride (SiOxNy),
a nitrogen content included in the silicon oxynitride is in a range of about 10 at % to about 35 at %,
a silicon content included in the silicon oxynitride is in a range of about 40 at % to about 50 at %, and
an oxygen content included in the silicon oxynitride is in a range of about 20 at % to about 50 at %.

14. The color conversion substrate of claim 1, wherein the capping structure is a second portion of the first capping film which contacts the bank and is disposed on a first portion of the first capping film which contacts the low refractive index layer, and
an oxygen content included in the second portion is greater than an oxygen content included in the first portion.

15. The color conversion substrate of claim 14, wherein a nitrogen content included in silicon oxynitride included in the second portion is in a range of about 0.2 at % to about 5 at %,
a silicon content included in the silicon oxynitride is in a range of about 30 at % to about 40 at %, and
an oxygen content included in the silicon oxynitride is in a range of about 50 at % to about 70 at %.

16. A display device comprising:
a first base substrate;
a second base substrate which faces the first base substrate;
a sealing member between the first base substrate and the second base substrate;
a color filter layer under the first base substrate;
a bank under the color filter layer, wherein an opening defining a plurality of pixels is defined in the bank;
a plurality of light emitting diodes on the second base substrate, wherein the plurality of light emitting diodes overlaps the plurality of pixels, respectively;
a color conversion layer on the plurality of light emitting diodes in the opening;
a low refractive index layer under the color filter layer, and on the color conversion layer and the bank; and
a capping layer under the low refractive index layer, and on the color conversion layer and the bank, wherein the capping layer includes a first capping film including silicon oxynitride (SiOxNy) having a nitrogen content in a range of about 10 at % to about 35 at % and a capping structure under the first capping film and including a material different from a material of the first capping film,
wherein the first capping film contacts the low refractive index layer and the capping structure contacts the bank.

17. The display device of claim 16, wherein a silicon content included in the silicon oxynitride included in the first capping film is in a range of about 40 at % to about 50 at %.

18. The display device of claim 16, wherein an oxygen content included in the silicon oxynitride included in the first capping film is in a range of about 20 at % to about 50 at %.

19. The display device of claim 16, wherein the sealing member is disposed under the color filter layer and the capping layer, and overlaps the color filter layer and the capping layer.

20. The display device of claim 19, wherein the capping layer surrounds a side surface of the low refractive index layer.

21. A method of manufacturing a color conversion substrate, the method comprising:

providing a color filter layer on a base substrate;

providing a low refractive index layer on the color filter layer;

providing a capping layer including a first capping film including silicon oxynitride (SiOxNy) having a nitrogen content in a range of about 10 at % to about 35 at % and a capping structure on the first capping film and including a material different from a material of the first capping film on the low refractive index layer;

providing a bank on the capping layer;

forming an opening defining a plurality of pixels by patterning the bank; and providing a color conversion layer on the capping layer in the opening, wherein the first capping film contacts the low refractive index layer and the capping structure contacts the bank.

22. The method of claim 21, wherein a silicon content included in the silicon oxynitride included in the capping layer is in a range of about 40 at % to about 50 at %.

23. The method of claim 21, wherein an oxygen content included in the silicon oxynitride included in the capping layer is in a range of about 20 at % to about 50 at %.

24. The method of claim 21, wherein the providing the capping layer includes performing a deposition process.

25. The method of claim 24, wherein a process gas of the deposition process includes hydrogen ($H_2$) gas, silane ($SiH_4$) gas, ammonia ($NH_3$) gas, nitrous oxide ($N_2O$) gas, or nitrogen ($N_2$) gas.

26. The method of claim 21, wherein when the opening is formed by patterning the bank, a side surface of the bank defining the opening is formed to be inclined at a taper angle along a thickness direction of the bank.

27. The method of claim 26, wherein the taper angle, which is an angle between an upper surface of the base substrate and the side surface of the bank, is about 90 degrees or less.

28. The method of claim 21, wherein when the opening is formed by patterning the bank, the opening is formed to have a shape of one selected from a circle, a triangle, a quadrangle, a pentagon, a hexagon, a heptagon, and an octagon.

29. The method of claim 21, wherein the capping structure is a second portion of the first capping film which contacts the bank and is disposed on a first portion of the first capping film which contacts the low refractive index layer, and an oxygen content included in the second portion is greater than an oxygen content included in the first portion.

30. The method of claim 29, wherein a nitrogen content included in silicon oxynitride included in the second portion is in a range of about 0.2 at % to about 5 at %, a silicon content included in the silicon oxynitride is in a range of about 30 at % to about 40 at %, and an oxygen content included in the silicon oxynitride is in a range of about 50 at % to about 70 at %.

31. The method of claim 21, further comprising:

providing a protective layer on the color conversion layer, and wherein the protective layer includes a same material as the capping layer.

32. The method of claim 31, wherein the protective layer includes silicon oxynitride (SiOxNy), a nitrogen content included in the silicon oxynitride is in a range of about 10 at % to about 35 at %, a silicon content included in the silicon oxynitride is in a range of about 40 at % to about 50 at %, and an oxygen content included in the silicon oxynitride is in a range of about 20 at % to about 50 at %.

* * * * *